United States Patent [19]
Otori et al.

[11] Patent Number: 5,670,409
[45] Date of Patent: Sep. 23, 1997

[54] METHOD OF FABRICATING A SEMICONDUCTOR IC DRAM DEVICE ENJOYING ENHANCED FOCUS MARGIN

[75] Inventors: Hiroshi Otori, Plano, Tex.; Kazuhiko Kajigaya, Iruma, Japan; Kazuyuki Miyazawa, Hidaka, Japan; Masaharu Kubo, Hachioji, Japan; Atsuyoshi Koike, Kokubunji, Japan; Fumiyuki Kanai, Hoya, Japan

[73] Assignee: Hitachi, Ltd., Tokyo, Japan

[21] Appl. No.: 511,810

[22] Filed: Aug. 7, 1995

[30] Foreign Application Priority Data

Aug. 10, 1994 [JP] Japan .................................. 6-188040

[51] Int. Cl.$^6$ .................................. H01L 21/8242
[52] U.S. Cl. .................. 437/60; 437/195; 437/228 PL
[58] Field of Search ........................ 437/48, 49, 60, 437/195, 228 PL, 919

[56] References Cited

U.S. PATENT DOCUMENTS

| | | | |
|---|---|---|---|
| 5,387,532 | 2/1995 | Hamamoto et al. | 437/60 |
| 5,405,798 | 4/1995 | Ema | 437/60 |
| 5,459,105 | 10/1995 | Matsuura | 437/228 PL |

OTHER PUBLICATIONS

Burke, IEEE VMIC Conference, Jun. 11–12, 1991, pp. 379–384.

Kaufman et al., J. Electrochem. Soc., vol. 138, No. 11, Nov. 1991, pp. 3460–3464.

Warnack, J. Electrochem. Soc., vol. 138, No. 8, Aug. 1991 pp. 2398–2402.

Patrick et al., J. Electrochem. Soc., vol. 138, No. 6, Jun. 1991, pp. 1778–1784.

*Primary Examiner*—Chandra Chaudhari
*Attorney, Agent, or Firm*—Antonelli, Terry, Stout & Kraus, LLP

[57] ABSTRACT

A method of fabricating a semiconductor integrated circuit device includes: recessing a second surface portion of a semiconductor substrate; forming elements of a first circuit region capable of performing a first function at a first surface portion of the semiconductor substrate and elements of a second circuit region capable of performing a second function at the recessed second surface portion of the semiconductor substrate, the elements of the first circuit region and those of the second circuit region having relatively small and large sizes as generally measured in a direction perpendicular to the surface portions of the semiconductor substrate, respectively; forming an insulating film to cover the first and second circuit regions, with a result that a level difference is caused between first and second portions of the insulating film on the first and second circuit regions at a relatively lower level and at a relatively higher level, respectively; effecting chemical-mechanical planarization of the insulating film to suppress the level difference in the insulating film for enhancing a focus margin for successive photolithographic steps; and forming wiring conductors on the insulating film with the suppressed level difference, enjoying the enhanced focus margin.

10 Claims, 20 Drawing Sheets

METHOD OF FABRICATING A SEMICONDUCTOR IC DRAM DEVICE ENJOYING ENHANCED FOCUS MARGIN

BACKGROUND OF THE INVENTION

The present invention relates to a technique for fabrication of a semiconductor integrated circuit (IC) device and more particularly to a technique effective for application to a planarization process of an interlayer insulating film in a semiconductor IC device in which a DRAM (Dynamic Random Access Memory) cell having a stacked capacitor structure is formed on a semiconductor substrate.

As the memory capacity of the DRAM increases, reduction in the occupation area of a DRAM cell has been stimulated. However, it has been known that the storage capacitance of a capacitor in the DRAM cell cannot generally be subjected to scaling from the standpoint of prevention of a soft error due to, for example, α-rays.

Therefore, in recent years, the DRAM fabrication process shows a tendency to adopt a DRAM cell having a cubical capacitor structure represented by a stacked capacitor in order to secure the storage capacitance of the capacitor while permitting the occupation area of the DRAM to be reduced.

In this structure, the storage capacitance can be increased by increasing the size of capacitor electrodes in a direction perpendicular to the substrate surface so as to increase the opposing side area of the capacitor electrodes without increasing the occupation area of the DRAM cell.

With this structure, however, an interlayer insulating film for covering a memory cell array region having a plurality of cubical DRAM cells juxtaposed therein and a peripheral circuit region having peripheral circuits laid therein is formed, with a level difference being caused between a portion of the insulating film on the memory cell region and another portion on the peripheral circuit region by an amount comparable to a height of the capacitor electrodes.

This level difference raises various problems including the necessity of counting on a sufficient depth of focus and the inevitable introduction of a high-level expensive sophisticated technique such as a phase shift technique when performing an exposure process for formation of wiring. Accordingly, in the fabrication process of the semiconductor IC device having the DRAM, the planarization process technique for interlayer insulating film has been very much thought of.

In the general CMP (Chemical Mechanical Polishing) process, an abrasive containing polishing particles dispersed in a polishing solution is used and with a predetermined polishing cloth brought into contact with the major surface of a semiconductor wafer, the polishing cloth or the semiconductor wafer is rotated in a plane parallel to its contact surface, so that chemical polishing based on the polishing solution and mechanical polishing based on the polishing particles are used in combination to effect a polishing process.

The CMP process technology is described, for example, in a paper in IEEE VMIC Conference, 11th to 12th of Jun., 1991, in "Semi-Empirical Modelling of SiO₂ Chemical-Mechanical Polishing Planarization", pp. 379–384, in a paper in J. Electrochem. Soc., November, 1991, No.11, Vol.138, in "Chemical-Mechanical Polishing for Fabricating Patterned W Metal Features as Chip Interconnects", pp. 3460–3464, in a paper in J. Electrochem. Soc., August, 1991, No. 8, Vol. 138, in "A Two-Dimensional Process Model for Chemimechanical Polish Planarization", pp. 2398–2402, in a paper in J. Electrochem. Soc., June, 1991, No. 6, Vol. 138, and in "Application of Chemical Mechanical Polishing to the Fabrication of VLSI Circuit Interconnections", pp. 1778–1784.

SUMMARY OF THE INVENTION

The present inventors have found the following problems encountered in applying the aforementioned CMP process technology used in the general semiconductor fabrication process to the fabrication process of the semiconductor IC device having the DRAM constructed of memory cells with stacked capacitors.

More particularly, in the CMP process, when the level difference is large in an interlayer insulating film to be polished, not only a higher level portion of the interlayer insulating film but also a lower level portion thereof is ground, making it difficult to apply the CMP process technology to such a device as the semiconductor IC device having the DRAM constructed of memory cells with stacked capacitors in which an interlayer insulating film is formed, with a large level difference in its surface being caused between its portions on the memory array region and the peripheral circuit region, respectively.

The relation between polishing time and polishing thickness which is based on data of experiments conducted by the present inventors to polish an inter-layer insulating film by applying thereto the CMP process is shown in FIG. 1. In the Figure, curve A represents data indicative of a level difference in the chip, curve B represents data indicative of the polishing thickness in an interlayer insulating film portion on the memory cell array region being at a higher level and curve C represents data indicative of the polishing thickness in another interlayer insulating film portion on the peripheral circuit region being at a lower level. Here, the interlayer insulating film to be polished is a silicon dioxide (SiO₂) film formed through, for example, bias ECR (Electron Cycrotoron Resonance) CVD (Chemical Vapor Deposition) process. The portion of this insulating film on the memory cell array covers Al wiring conductors.

As will be seen from FIG. 1, during a polishing time period of from 0 to 80 seconds, for example, the interlayer insulating film portion on the memory cell array region (higher level region) is ground successfully (curve B), indicating that the level difference in the chip can be decreased (curve A), but even the interlayer insulating film portion on the peripheral circuit region (lower level region) begins to be ground around a polishing time of 80 seconds (curve C).

In other words, after the polishing time has elapsed to a certain extent, curve B indicative of the polishing thickness of the higher level region and curve C indicative of the polishing thickness of the lower level region extend substantially in parallel with other, demonstrating that during lapse of the polishing time following 80 seconds, the level difference per se between the higher level region and the lower level region remains almost unchanged.

An object of the present invention is to improve the planarity of an insulating film in a fabrication process of a semiconductor IC device including first and second circuit regions which are formed in first and second surface portions of a semiconductor substrate, respectively, the first and second circuit regions being capable of performing first and second functions, respectively, and having relatively small and large sizes perpendicular to the substrate surface portion, respectively.

Another object of the present invention is to improve the planarity of an insulating film in a fabrication process of a semiconductor IC device having a DRAM constructed of memory cells with stacked capacitors.

According to one aspect of the present invention, a surface portion of a semiconductor substrate is recessed in which elements of the above-mentioned second circuit region having a relatively large size in the direction perpendicular to the substrate surface portions are formed, elements of the above-mentioned first circuit region having a relatively small size in the direction perpendicular to the substrate surface portions are formed in another surface portion of the semiconductor substrate, an insulating film is formed to cover the first and second circuit portions, with a result that a level difference is caused in the insulating film, the insulating film is subjected to a chemical-mechanical planarization process to suppress the level difference in the insulating film for enhancing a focus margin for successive photolithographic steps, and at least one wiring conductor is formed on the insulating film with the suppressed level difference, enjoying the enhanced focus margin.

According to another aspect of the present invention, a method of fabricating the semiconductor IC device has the steps of forming a recessed region in a semiconductor substrate, forming an array of memory cells with stacked capacitors in the recessed region, and applying a CMP process to at least one of insulating films formed on and above the memory cell array.

According to still another aspect of the present invention, the method of fabricating the semi-conductor IC device has the step of forming, on the insulating film, a stop layer for indicating the end of a polishing process in advance of the CMP process.

DESCRIPTION OF THE PREFERRED EMBODIMENTS

The present invention will now be described by way of example with reference to the accompanying drawings.
(Embodiment 1)

Figure 1:
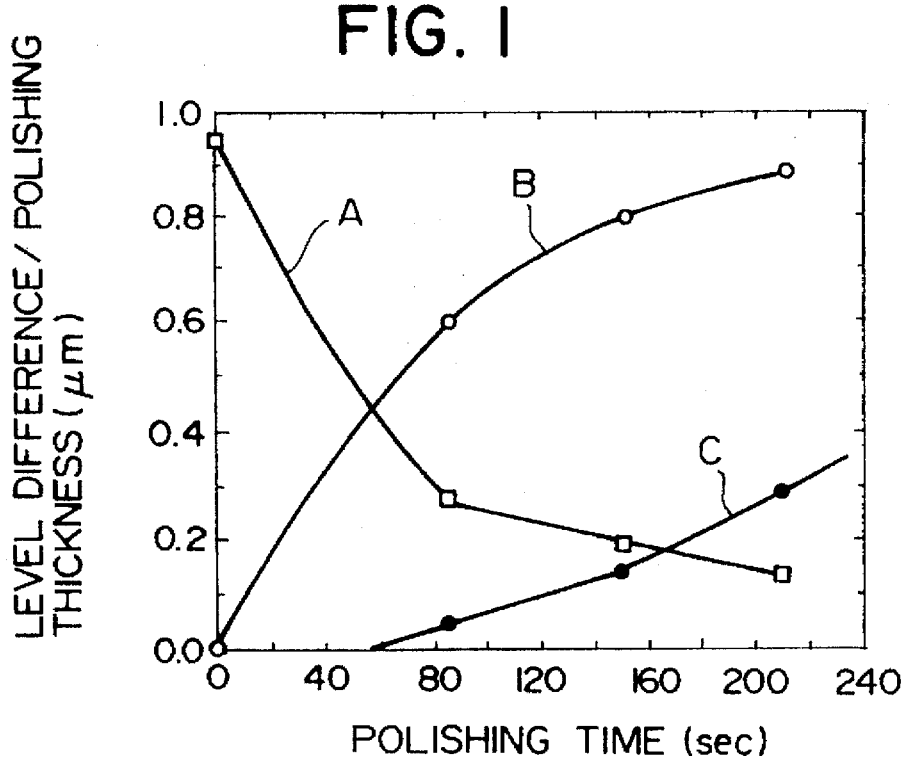
FIG. 1 is a graph showing the relation between the time for polishing the surface of an interlayer insulating film having a large level difference and the polishing thickness, obtained as a result of study by the present inventors.
Figure 6:
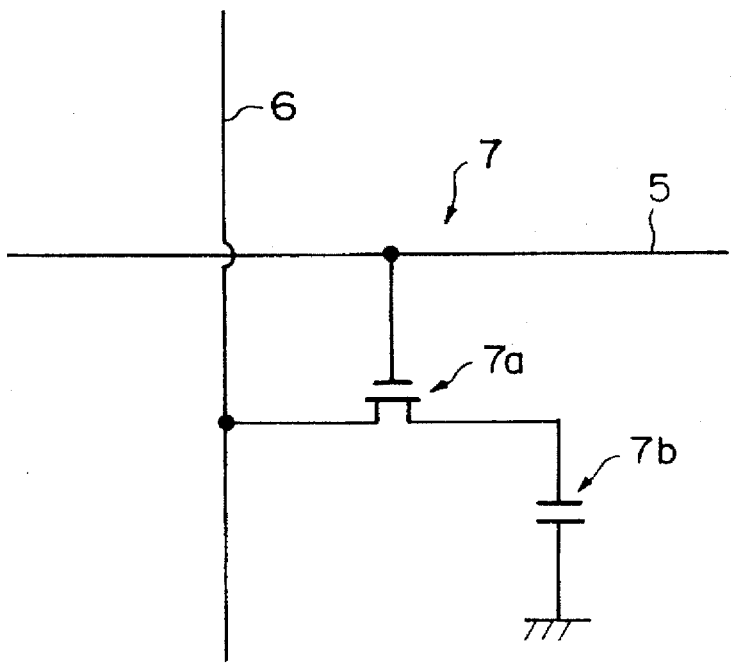
FIG. 6 is a circuit diagram of a memory cell of the FIG. 2 semiconductor IC device.
Figure 2:
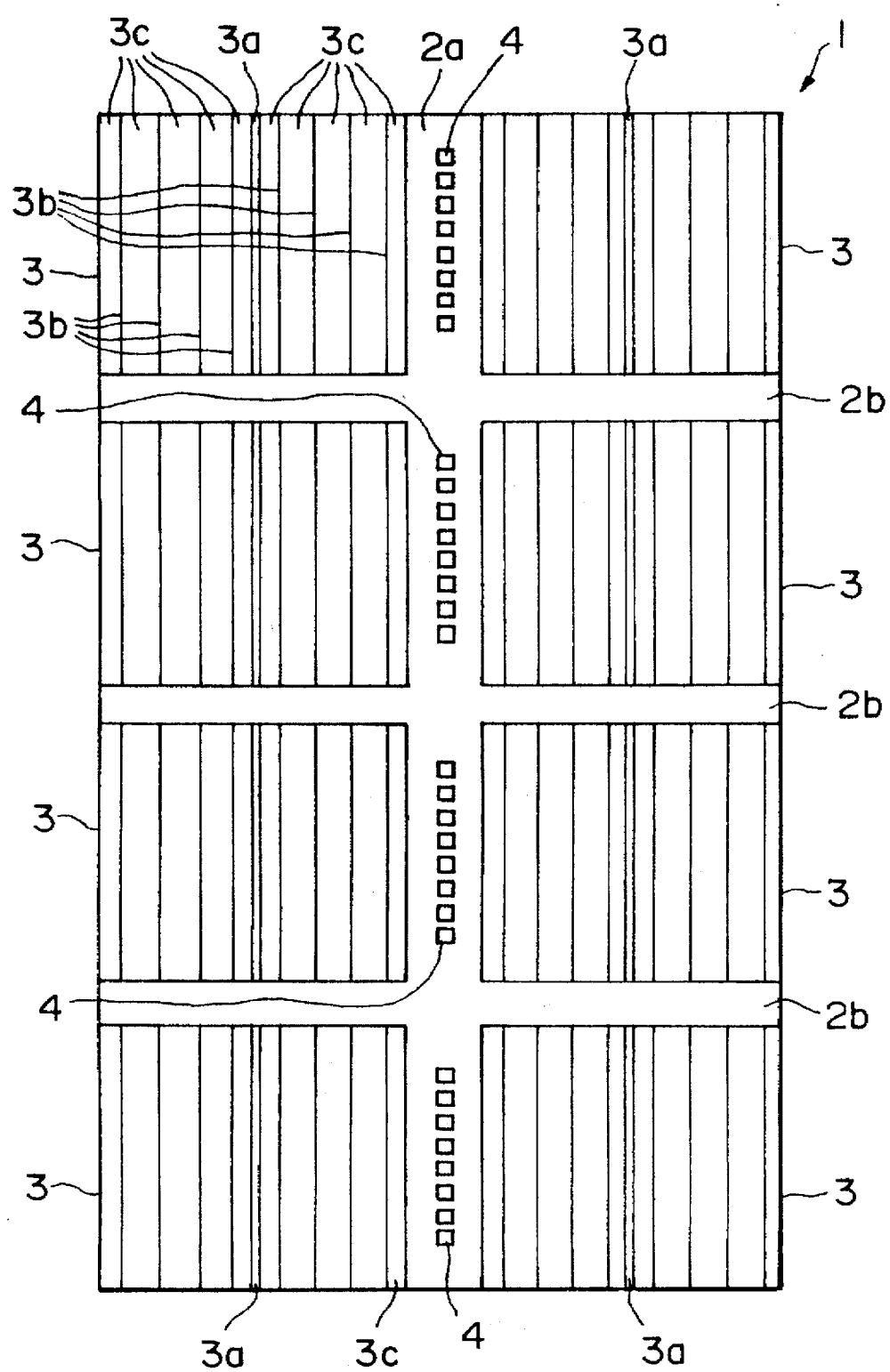
FIG. 2 is a plan view of a semiconductor chip constituting a semiconductor IC device according to an embodiment of the present invention.
Figure 3:
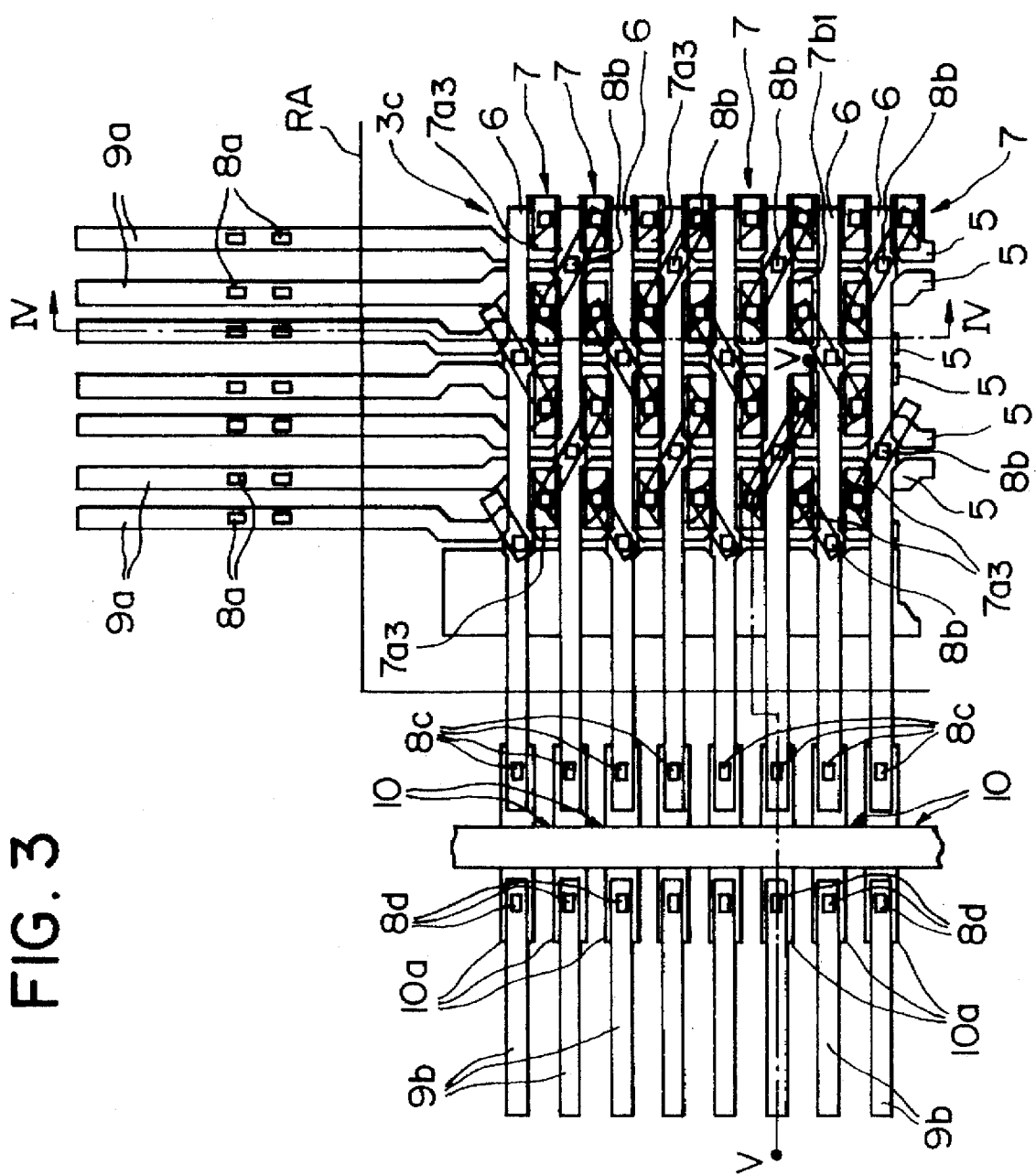
FIG. 3 is a plan view showing the essential part of the FIG. 2 semiconductor IC device.
Figure 4:
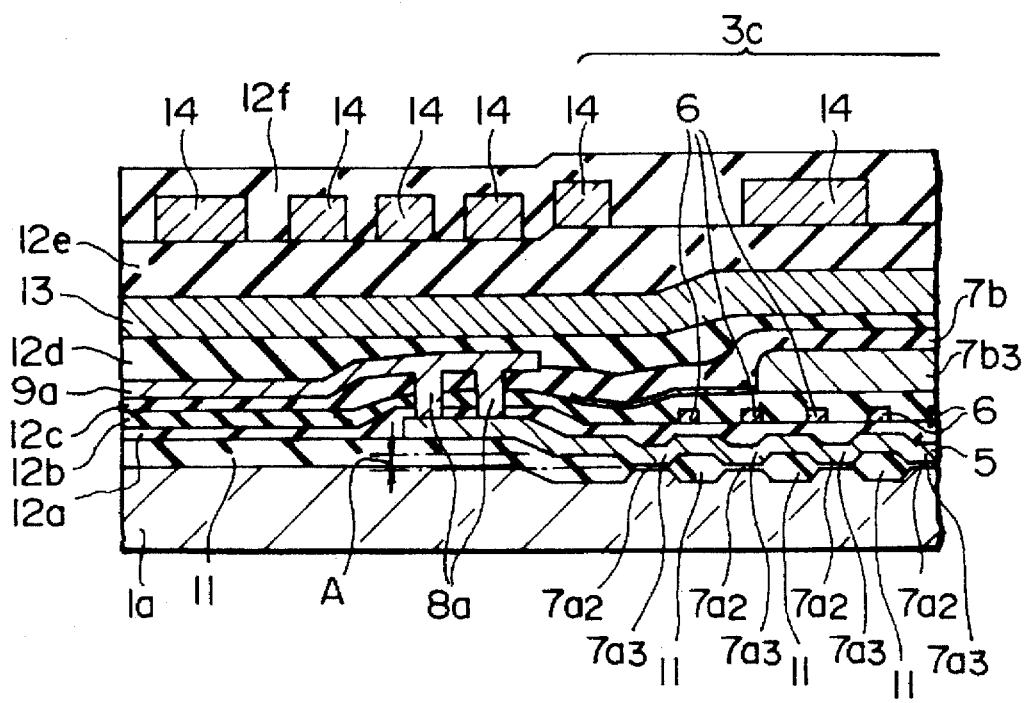
FIG. 4 is a sectional view taken on line IV—IV of FIG. 3.
Figure 5:
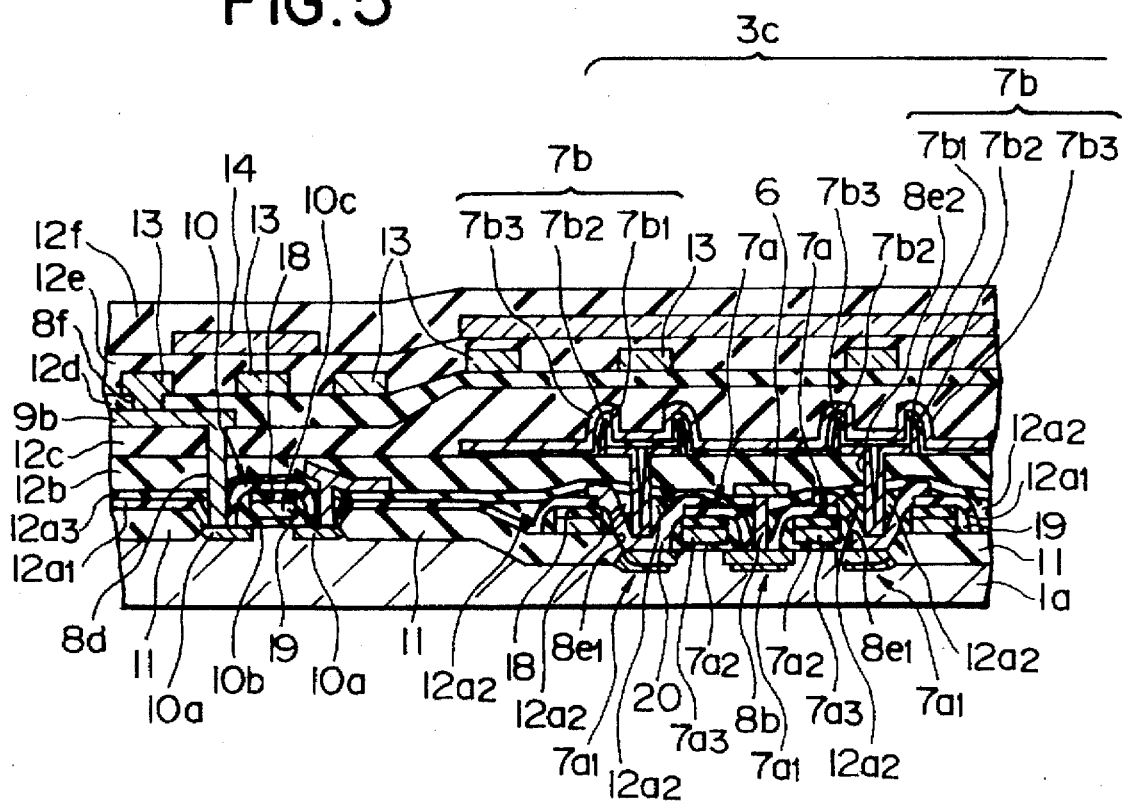
FIG. 5 is a sectional view taken on line V—V of FIG. 3.
Figure 21:
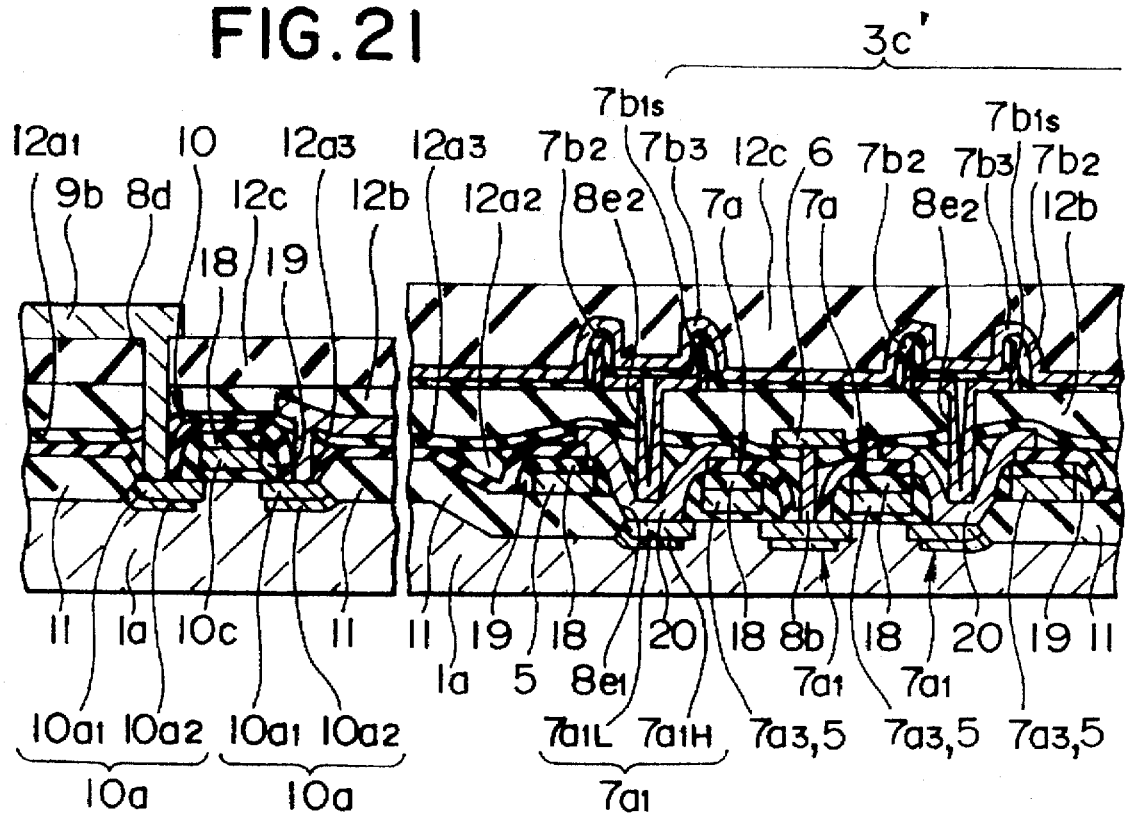
Figure 22:
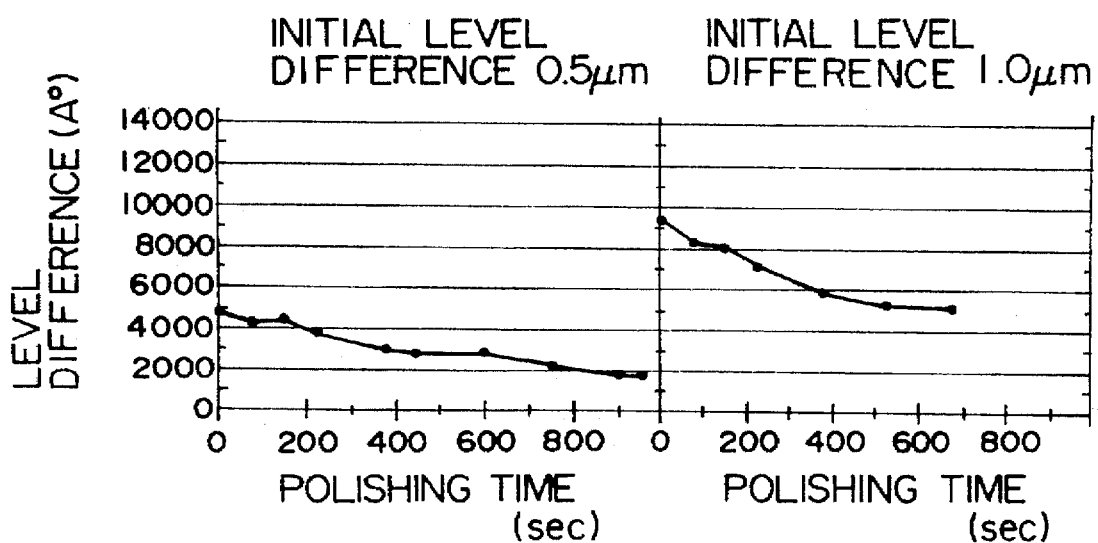
FIG. 22 is a graph useful to compare the case where the initial level difference in an underlying insulating film is high before the CMP process with the case where the initial level difference is low, for the relation between polishing time and polishing thickness.
Figure 26:
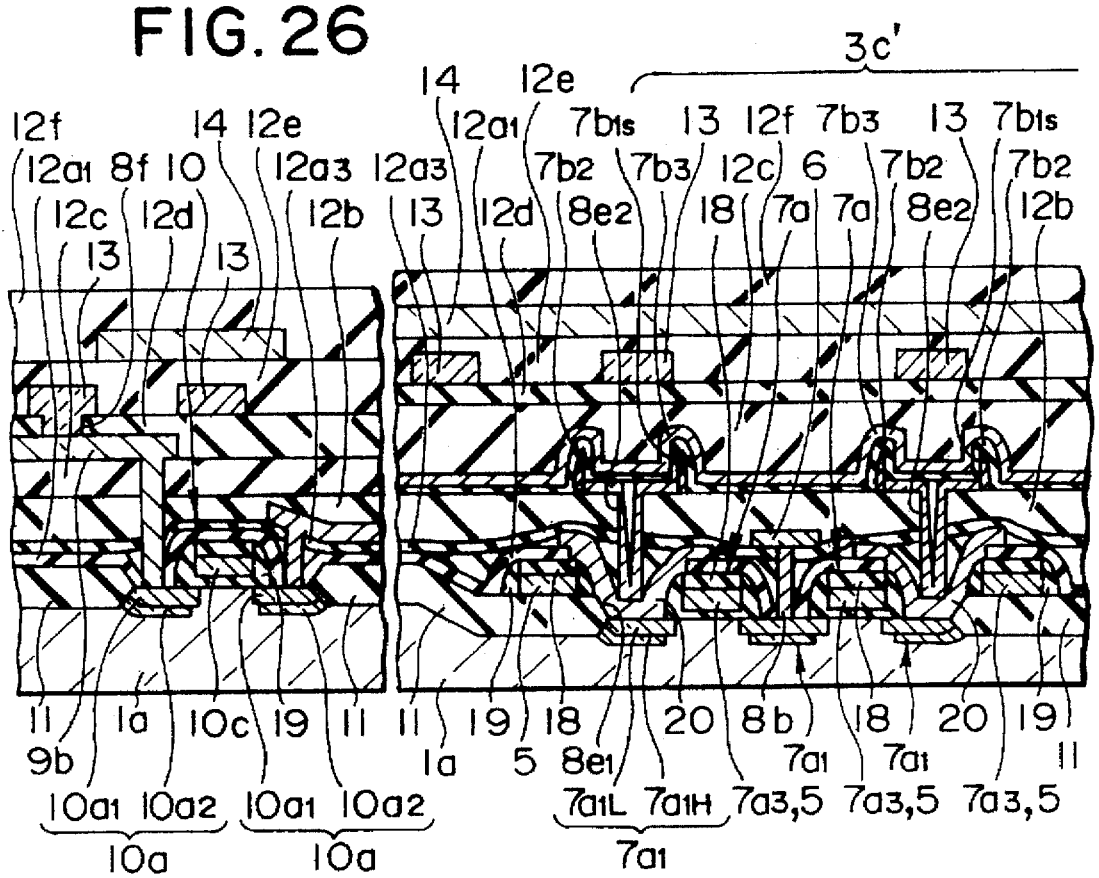
Figure 27:
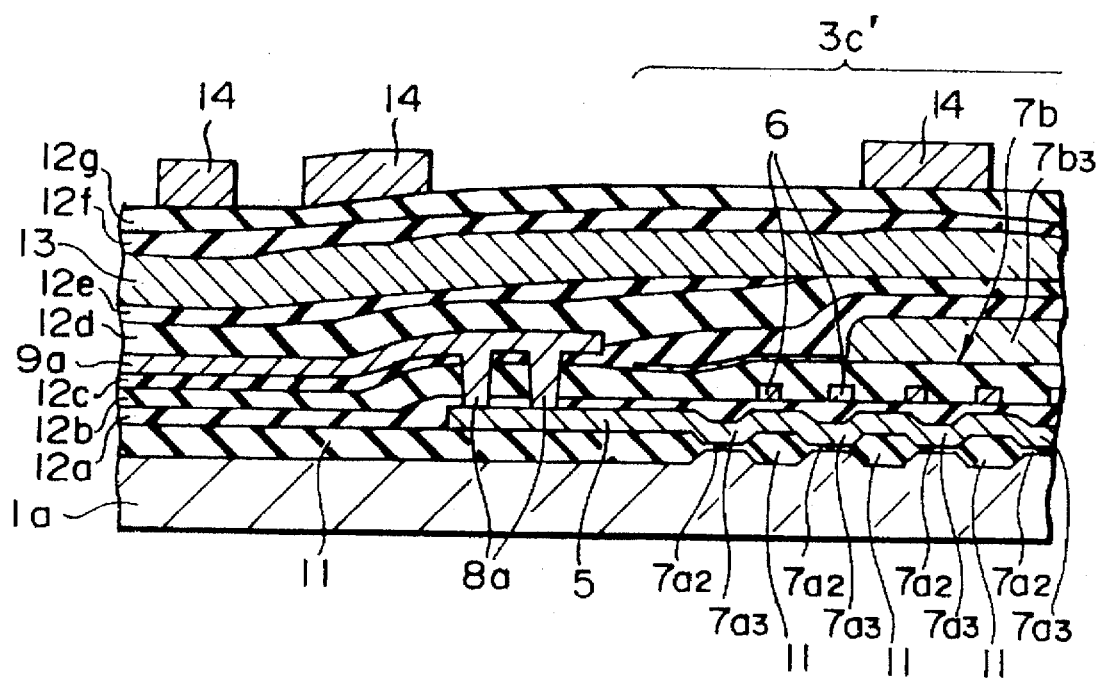
FIGS. 27 and 28 are sectional views showing the essential part of a semiconductor substrate for which neither the recess technique nor the CMP technique is used.
Figure 28:
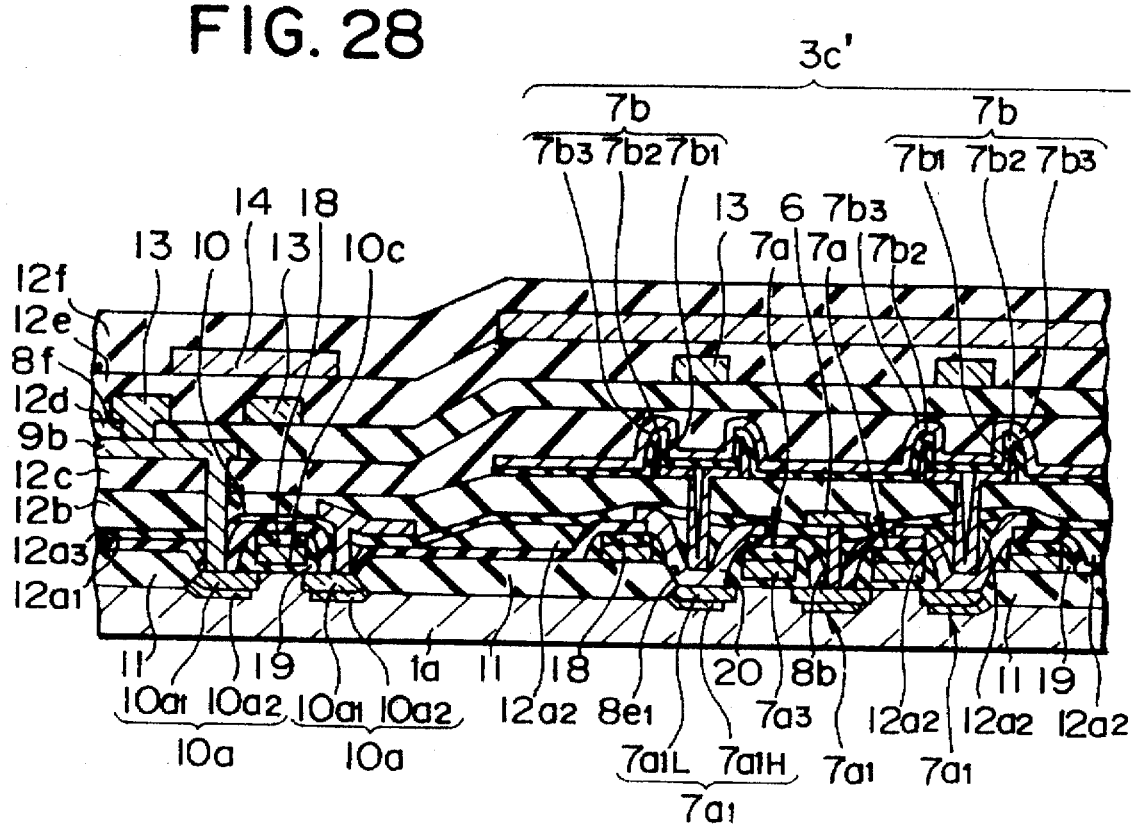
Figure 29:
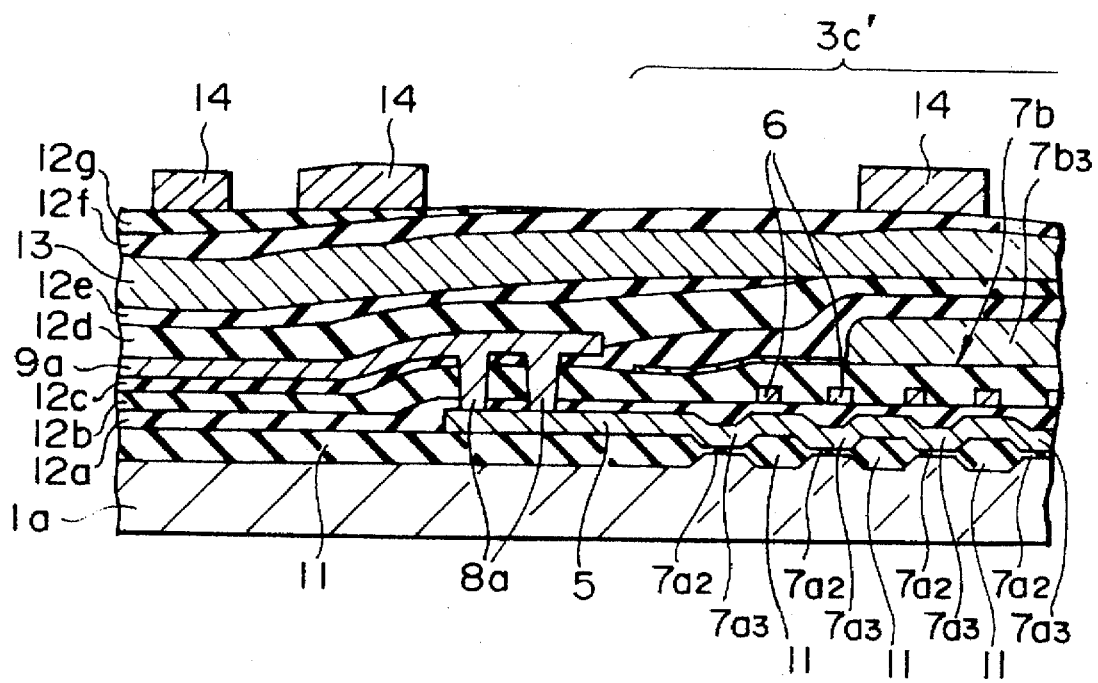
FIGS. 29 and 30 are sectional views showing the essential part of a semiconductor substrate for which only the CMP technique is used without resort to the recess technique.
Figure 30:
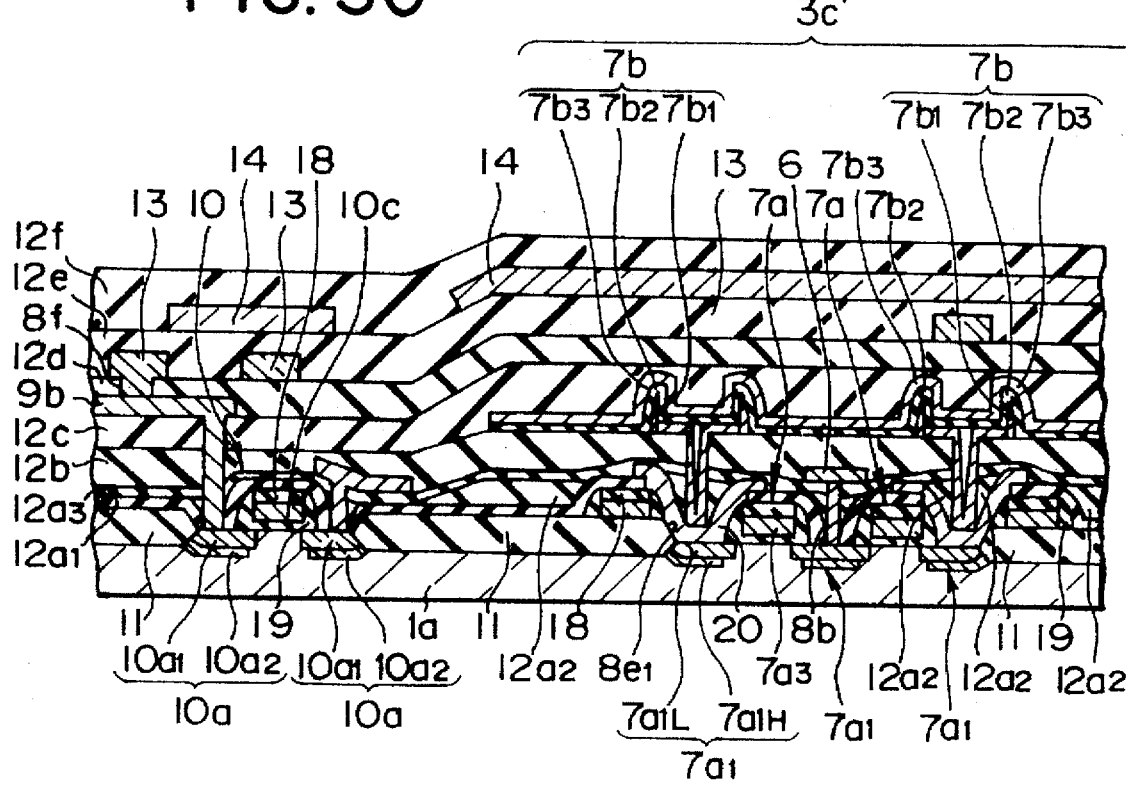
Figure 31:
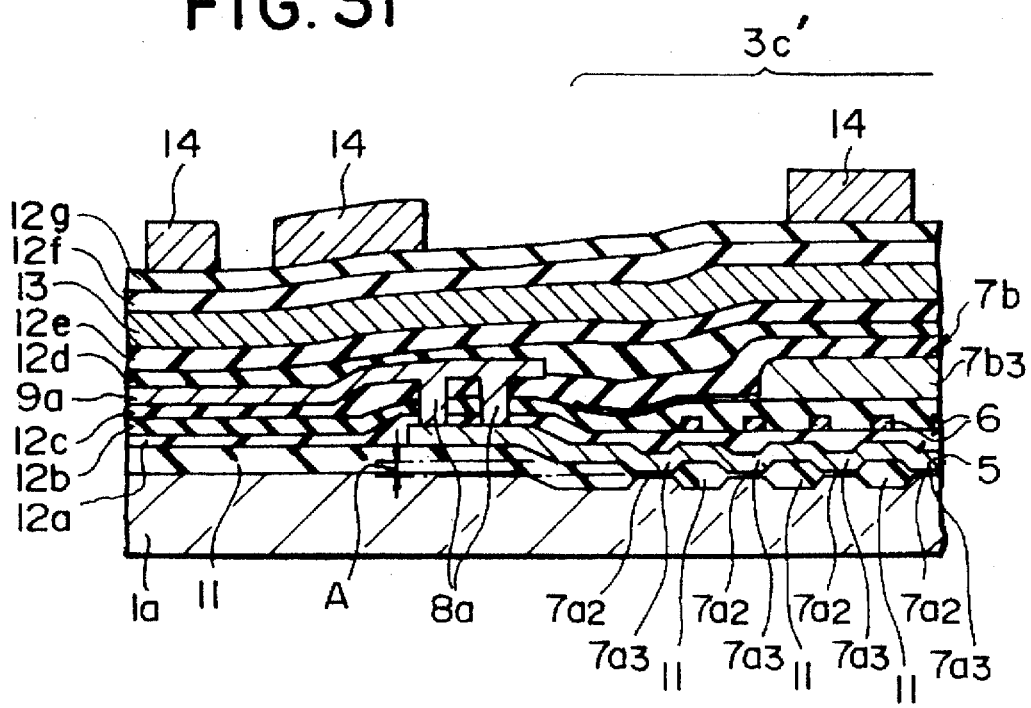
FIGS. 31 and 32 are sectional view showing the essential part of a semiconductor substrate for which only the recess technique is used without resort to the CMP technique.
Figure 32:
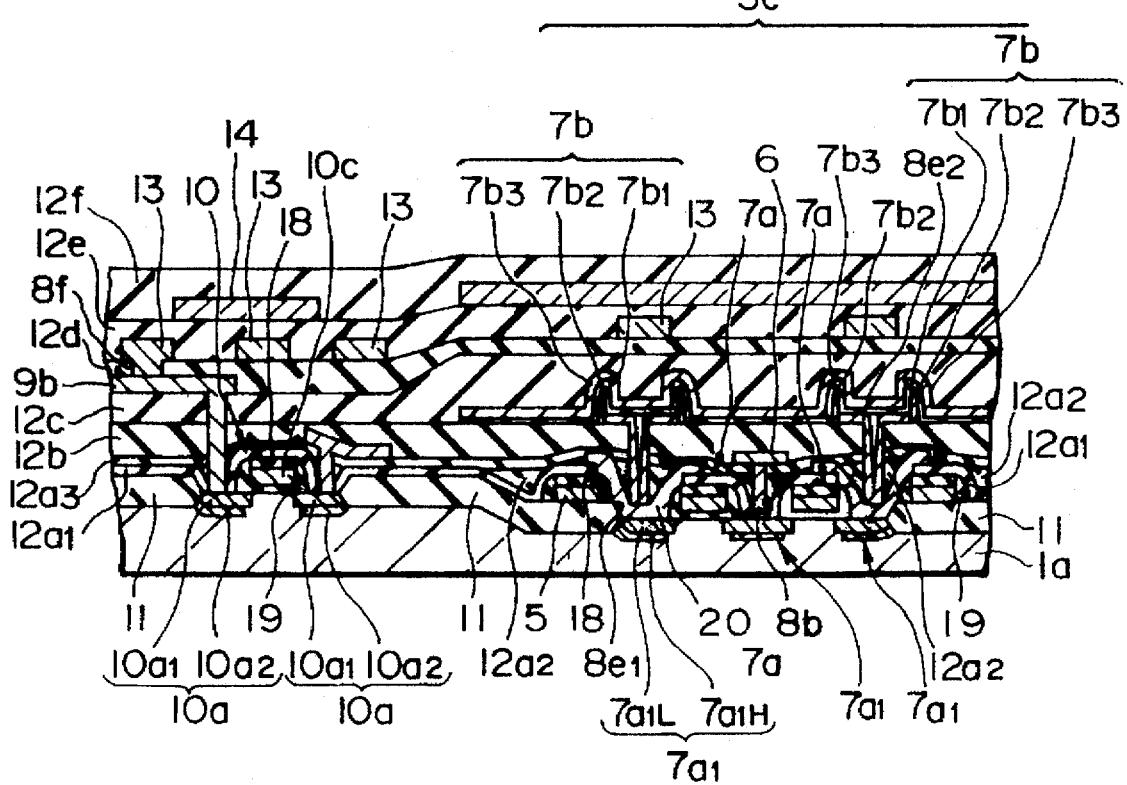

FIG. 2 is a plan view of a semiconductor chip constituting a semiconductor IC device according to an embodiment of the present invention, FIG. 2 is a plan view showing the essential part of the FIG. 2 semiconductor IC device, FIGS. 4 and 5 are sectional views taken on lines VI—VI and V—V of FIG. 3, respectively, FIG. 6 is a circuit diagram of a memory cell in the FIG. 2 semiconductor IC device, FIGS. 7 to 21 and FIGS. 23 to 26 are sectional views showing the essential step in the fabrication process of the FIG. 2 semiconductor IC device, FIG. 22 is a graph for comparing the case where the initial level difference in an underlying insulating film is high before the CMP process with the case where the initial level difference being is low, for the relation between polishing time and polishing thickness, FIGS. 27 and 28 are sectional views showing the essential part of a semiconductor substrate for which neither the recess technique nor the CMP technique is used, FIG. 29 and 30 are sectional views showing the essential part of a semiconductor substrate for which only the CMP technique is used without resort to the recess technique, and FIGS. 31 and 32 are sectional views showing the essential part of a semiconductor substrate for which only the recess technique is used without resort to the CMP technique.

For example, the semiconductor IC device of the present embodiment 1 is a 64M-bit DRAM. A semiconductor chip constituting the semiconductor IC device is shown in plan view form in FIG. 2.

The semiconductor chip 1 is formed of, for example, a rectangular small piece of silicon (Si) single crystal and has a size of about 10 mm×20 mm. The major surface of the semiconductor chip 1 is divided into peripheral circuit regions 2a, 2b, 3a and 3b and a plurality of memory block regions 3.

The peripheral circuit region 2a is laid on the center line of the major surface of the semiconductor chip 1 to extend in the longitudinal direction of the semiconductor chip 1. Formed in the peripheral circuit portion 2a are, for example, peripheral circuits (not shown) such as input circuits, output circuits, control circuits and power supply circuits.

The input circuit is a circuit adapted to convert a signal supplied to the semiconductor chip 1 from an external electronic device into a potential state conforming to a semiconductor IC circuit in the semiconductor chip 1.

The output circuit is a circuit for converting a signal transmitted from the semiconductor chip 1 to the external electronic device into a potential state conforming to the electronic device by, for example, amplifying the signal so that the signal may not be attenuated in a long transmission line.

The control circuit is a circuit for controlling the operation of semiconductor IC's in the semiconductor chip 1. The power supply circuit is a circuit for supplying a predetermined potential to the semiconductor IC's in the semiconductor chip 1.

A plurality of bonding pads 4 are arranged on center line of the peripheral circuit region 2a in the longitudinal direction of the semiconductor chip 1. The bonding pad is an electrode for electrically connecting the semiconductor IC in the semiconductor chip 1 to the electronic device which is external of the semiconductor chip 1.

Though not shown, the bonding pad 4 can be connected electrically, through a bonding wire, to an inner lead inside a package for sealing the semiconductor chip 1.

The peripheral circuit region 2b intersects the peripheral circuit region 2a on the center line of the semiconductor chip 1 to extend in the direction of width of the semiconductor chip 1. Formed in the peripheral circuit region 2b are, for example, peripheral circuits (not shown) such as row decoder circuits and address buffer circuits.

In each memory block region 3, memory blocks are formed and each memory block is divided into a plurality of unit memory regions 3c by the peripheral circuit region 3a laid on the center line of each memory block and the peripheral circuit regions 3b laid on both sides of the peripheral circuit region 3a at predetermined intervals.

Arranged in the central peripheral circuit region 3a are, for example, column decoder circuits and address buffer circuits. Arranged in the peripheral circuit region 3b are, for example, a plurality of sense amplifier circuits which are arranged in the direction of extension of the peripheral circuit region 3b.

In the unit memory region 3c, a plurality of memory cells to be described later are arranged regularly in the longitudinal and lateral directions. In the present embodiment 1, the unit memory region capable of achieving a function (second function) of storing data is arranged in a depressed second surface portion of the substrate (hereinafter referred to as a recessed region) which is lower than a first surface portion of the substrate in which, for example, a sense amplifier capable of achieving a signal amplifying function (first function) is formed.

A corner and its neighborhood of the substantially rectangular unit memory region 3c of the semiconductor IC device according to the present embodiment 1 are shown in plan view form in FIG. 3. In the Figure, RA indicates a substantial center line of a boundary region between the recessed region (the second surface portion of the substrate) and the first surface portion of the substrate. The substrate surface level on the unit memory region 3c side is lower along the center line RA of the boundary region than that of a substrate surface portion surrounding the unit memory region.

In the unit memory region 3c, word lines 5 and data lines 6 are laid so as to be perpendicular to each other and a memory cell 7 is arranged near an inter-section of each word line 5 and each data line 6.

The word line 5 is formed by, for example, depositing tungsten silicide ($WSi_2$) on poly-silicon of low resistance and part of the word line functions as a gate electrode 7a3 of a transfer MOS FET of memory cell 7 to be described later. Denoted by 7b1 is a lower electrode (FIG. 5) of a capacitor 7b constituting the memory cell 7.

The word lines 5 are electrically connected to first level wiring conductors 9a of, for example, tungsten through contact holes 8a and further electrically connected to the previously-described row decoder circuit (not shown) by way of the first level wiring conductors 9a.

The data line 6 is formed by, for example, depositing $WSi_2$ on poly-silicon of low resistivity and is electrically connected to a semiconductor region of the transfer MOS FET of memory cell 7 to be described later through a contact hole 8b and further electrically connected to one of semiconductor regions 10a, 10a of a switching MOS FET 10, adapted to connect the data line to the sense amplifier, through a contact hole 8c.

The other of the semiconductor regions 10a, 10a of the switching MOS FET 10 is electrically connected to a first level wiring conductor 9b of, for example, tungsten through a contact hole 8d and further electrically connected to the previously-described sense amplifier circuit (not shown) by way of the first level wiring conductor 9b.

Sections taken on lines IV—IV and V—V of FIG. 3 are shown in FIGS. 4 and 5, respectively. A circuit diagram of a memory cell is shown in FIG. 6.

For convenience of explanation, second level wiring conductors and third level wiring conductors, both of which are not shown in FIG. 3, are depicted in FIGS. 4 and 5 with a view of indicating a structure on each level in the semiconductor IC device.

A semiconductor substrate 1a constituting the semiconductor chip 1 is made of, for example, p-type silicon single crystal. As described hereinbefore, the unit memory region 3c is formed in a depression of the semiconductor substrate 1athat is, a recessed region. A recess depth A is, for example, about 0.3 µm. A field insulating film 11 for element isolation made of, for example, $SiO_2$ is formed on the surface of the semiconductor substrate 1a.

The memory cell 7 includes a single transfer MOS FET 7a and a single capacitor 7b.

The transfer MOS FET 7a is formed in an element forming region surrounded by the field insulating film 11 and includes a pair of semiconductor regions 7a1 formed in a surface portion of the semiconductor substrate 1aa gate insulating film 7a2 formed on the semiconductor substrate 1aand a gate electrode 7a3 deposited on the gate insulating film 7a2.

An n-type impurity such as phosphorous or arsenic has been introduced into the paired semiconductor regions 7a1. The data line 6 is electrically connected to one of the paired semiconductor regions 7a1 and a lower electrode 7b1 of the capacitor 7b is electrically connected to the other through contact holes 8e1 and 8e2. The gate insulating film 7a2 is made of, for example, $SiO_2$.

The capacitor 7b is a storage for storing information of "1" or "0" in accordance with the presence or absence of an electric charge in excess of a predetermined amount and is formed on a higher level than the data line 6. The capacitor 7b includes the lower electrode 7b1, a dielectric film 7b2 deposited thereon and an upper electrode 7b3 deposited on the dielectric film and in the present embodiment 1, a crown type capacitor in a cylindrical form is exemplarily used as the capacitor 7b.

The lower electrode 7b1 is made of, for example, poly-silicon of low resistivity. The dielectric film 7b2 is made of, for example, tantalum oxide ($Ta_2O_5$) and has a thickness of, for example, about 3 nm. The upper electrode 7b3 is made of, for example, tungsten. The capacitor 7b has a storage capacity of, for example, about 20fF or more.

The switching MOS FET 10 is formed in the element forming region (the first surface portion of the substrate) surrounded by the field insulating film 11 and includes a pair of semiconductor regions 10a and 10a formed in a surface portion of the semiconductor substrate 1a, a gate insulating film 10b formed on the semiconductor substrate 1a and a gate electrode 10c formed on the gate insulating film 10b.

An n-type impurity such as phosphorous or arsenic has been introduced into one semiconductor region 10a. The gate insulating film 10b is made of, for example, $SiO_2$. The gate electrode 10c is formed by, for example, depositing $WSi_2$ on poly-silicon of low resistivity.

On the other hand, an insulating film 12a1 for covering the transfer MOS FET 7a and the switching MOS FET 10 is made of, for example, $SiO_2$. An insulating film 12a2 is made of, for example, BPSG (Boro-Phosphor Silicate Glass). Further, an insulating film 12a3 overlying the insulating film 12a2 is made of, for example, $SiO_2$. Insulating films 12b and 12c deposited sequentially on the insulating film 12a3 are also made of, for example, BPSG. In FIG. 4, the insulating films 12a1 to 12a3 are generally indicated by 12a.

An insulating film 12d deposited on the insulating film 12c is formed of, for example, a TEOS (Tetraethoxysilane) film and a SOG (Spin-On-Glass) film so as to cover the first level wiring conductors 9a and 9b. The insulating film 12e deposited on the insulating film 12d is also formed of, for example, TEOS and SOG films.

Formed on the insulating film 12d are second level wiring conductors 13 made of, for example, aluminum (Al) or Al-Si-Cu alloy. The second level wiring conductors 13 are electrically connected to the first level wiring conductors 9b through contact holes 8f formed in the insulating film 12d.

In the present embodiment 1, the surface of the insulating film 12d is subjected to a planarization process by a CMP technique to be described later. In other words, the second level wiring conductors 13 are formed on the substantially planarized underlying insulating film.

Formed on the insulating film 12e are third level wiring conductors 14 made of, for example, Al or Al-Si-Cu alloy. The surface of the insulating film 12e is also subjected to a planarization process by the CMP technique and therefore, the third level wiring conductors 14 are also formed on the substantially planarized insulating film.

Deposited on the insulating film 12e is an insulating film 12f made of, for example, $SiO_2$, with the result that the third level wiring conductors 14 are covered with the insulating film 12f. The surface of the insulating film 12f is also subjected to a planarization process by any means.

Incidentally, in the present embodiment 1, the underlying insulating films 12d and 12e for the second and third level wiring conductors 13 and 14 are substantially planarized. Through this, a structure as below can be provided.

Firstly, the second and third level wiring conductors 13 and 14 are formed pursuant to a rule comparable to a design rule of the memory cell. In this case, the design rule includes a wiring conductor width, a wiring conductor spacing and the like.

This is due to the fact that by planarizing the underlying insulating films 12d and 12e for the second and third level wiring conductors 13 and 14 in the present embodiment 1, the focus margin in the succeeding exposure process for formation of the wiring conductors can be enhanced and besides, coverage of the wiring material can be promoted to prevent short-circuiting of wiring conductors and defective wiring (wiring conductor disconnection) due to defective coverage.

Secondly, the second and third level wiring conductors 13 and 14 can also be laid on a boundary region between the first surface portion and recessed region of the substrate and the spacing between adjacent wiring conductors on the boundary region can be twice or less the minimum wiring spacing, thus being reduced as compared to the spacing by the conventional techniques.

The reason for this is that while wiring conductors are usually not laid or are usually laid at a spacing of twice or more the minimum wiring spacing by taking into consideration wiring conductor short-circuiting and defective wiring (wiring conductor disconnection) due to defective coverage of the wiring material, the underlying insulating films 12d and 12e for the second and third level wiring conductors 13 and 14 are planarized in the case of the present embodiment 1 and consequently, short-circuiting and defective wiring (wiring conductor disconnection) does not occur.

Thirdly, Al is used as the material of the second and third level wiring conductors 13 and 14. This permits the wiring resistance to be reduced and hence the operation speed of the semiconductor IC device can be improved.

To explain, conventionally, Al cannot be used as the wiring material because a wiring conductor of Al tends to deteriorate when the level difference in the underlying insulating film for the wiring conductor is large and, therefore, tungsten or tungsten silicide having a higher resistivity than Al has been used. In the present embodiment 1, however, the underlying insulating films for the second and third level wiring conductors 13 and 14 are planarized and as a result, stability of the wiring formation process can be enhanced even when Al is used as the material of the second and third level wiring conductors 13 and 14 and therefore, reliability of wiring can be secured.

A method of fabricating the semiconductor IC device of the present embodiment 1 will now be described with reference to FIGS. 7 to 26. In FIGS. 7 to 21 and FIGS. 23 to 26, the left side indicates a peripheral circuit region and the right side a memory cell forming region 3c'.

Figure 7:
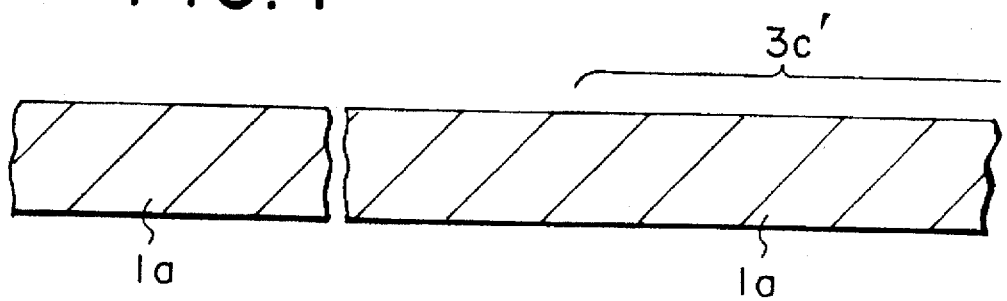
FIGS. 7 to 21 and FIGS. 23 to 26 are sectional views showing the essential step in a process for fabrication of the FIG. 2 semiconductor IC device.

Firstly, as shown in FIG. 7, a semiconductor substrate 1a made of, for example, p-type silicon single crystal is prepared. In this phase, the semiconductor substrate 1a takes the form of a substantially circular planar semiconductor wafer.

Figure 8:
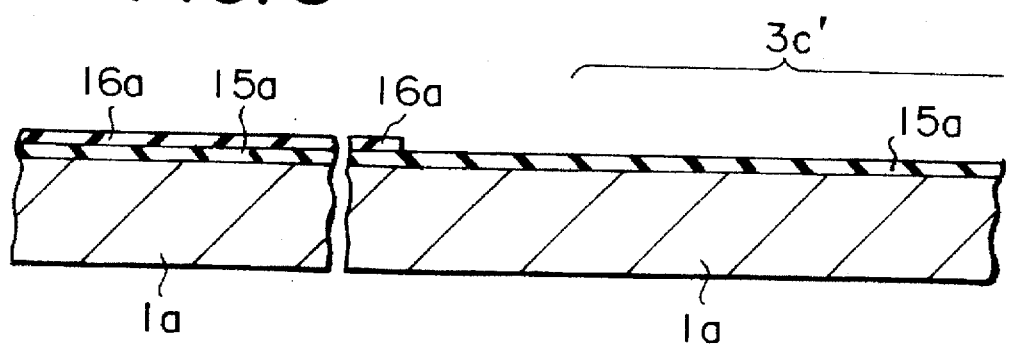

Subsequently, as shown in FIG. 8, an oxidized film 15a of, for example, $SiO_2$ and an oxidation proof film of, for example, $Si_3N_4$ are deposited sequentially on the major surface of the semiconductor substrate 1a and then, a part of the oxidation proof film overlying a part of the substrate surface which is to be recessed is removed by etching to form an oxidation proof film pattern 16a which is cleared off to allow the memory cell forming portion 3c' to expose.

Figure 9:
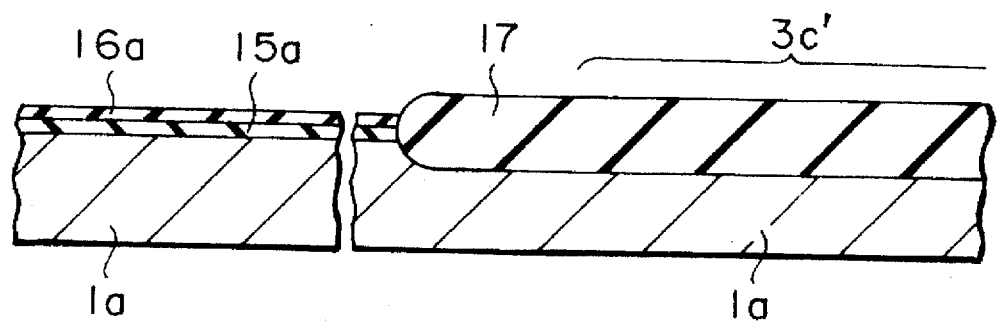

Thereafter, the semiconductor substrate 1a is subjected to a thermal oxidation process, so that as shown in FIG. 9 an insulating film 17 is selectively formed at a part of the semiconductor substrate 1a which is not covered with the oxidation proof film pattern 16a.

Figure 10:
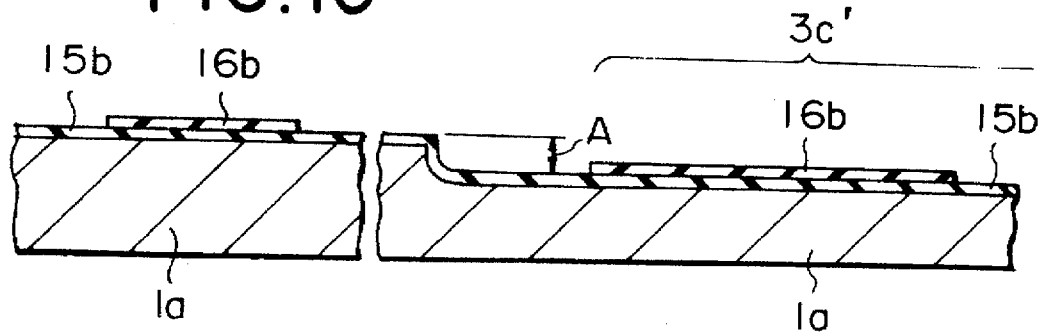

After the oxidation proof film pattern 16a is removed, the oxidized film 15a and the insulating film 17 are removed using, for example, hydrofluoric acid (HF) to form a recessed region in the major surface of the semiconductor substrate 1a at the memory forming region 3c' as shown in FIG. 10. A smooth slope is formed which is contiguous to an end of the recess portion. A recess depth A in the recessed region is, for example, about 0.4 to 0.5 μm.

Next, a pad film 15b of, for example, $SiO_2$ and an oxidation proof film of, for example, $Si_3N_4$ are deposited sequentially on the major surface of the semiconductor substrate 1a and then part of the oxidation proof film is removed by etching a portion where a film in the element isolation region is to be formed, thus forming an oxidation proof film pattern 16b.

Figure 11:
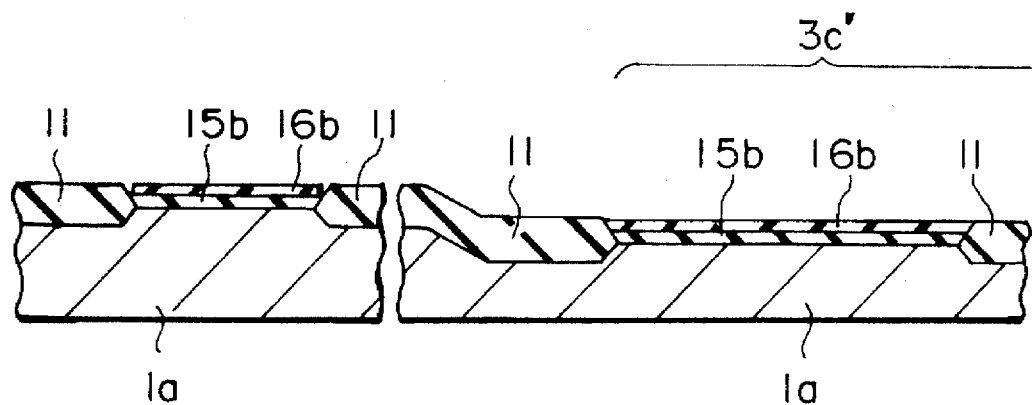

Subsequently, the semiconductor substrate 1a is subjected to a thermal oxidation process, with the result that a field insulating film 11 is selectively formed in the element isolation region of semiconductor substrate 1a which is not covered with the oxidation proof film pattern 16b as shown in FIG. 11, and thereafter the oxidation proof film pattern 16b is removed.

Figure 12:
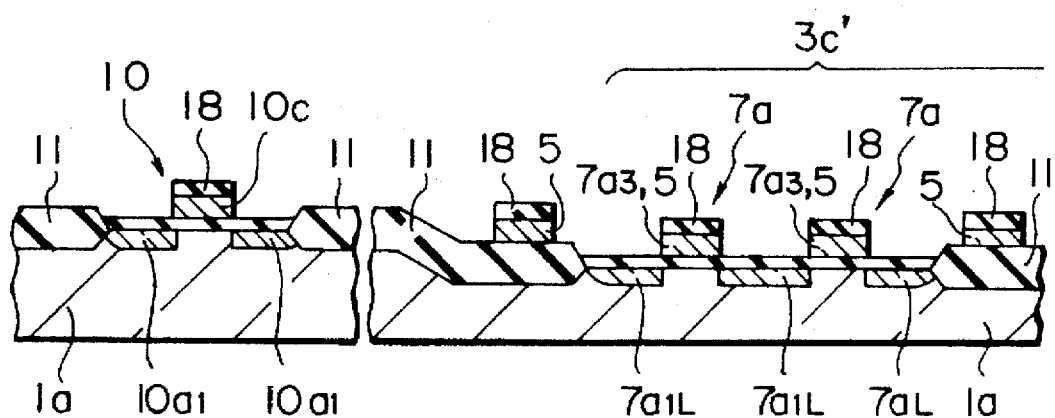
Figure 13:
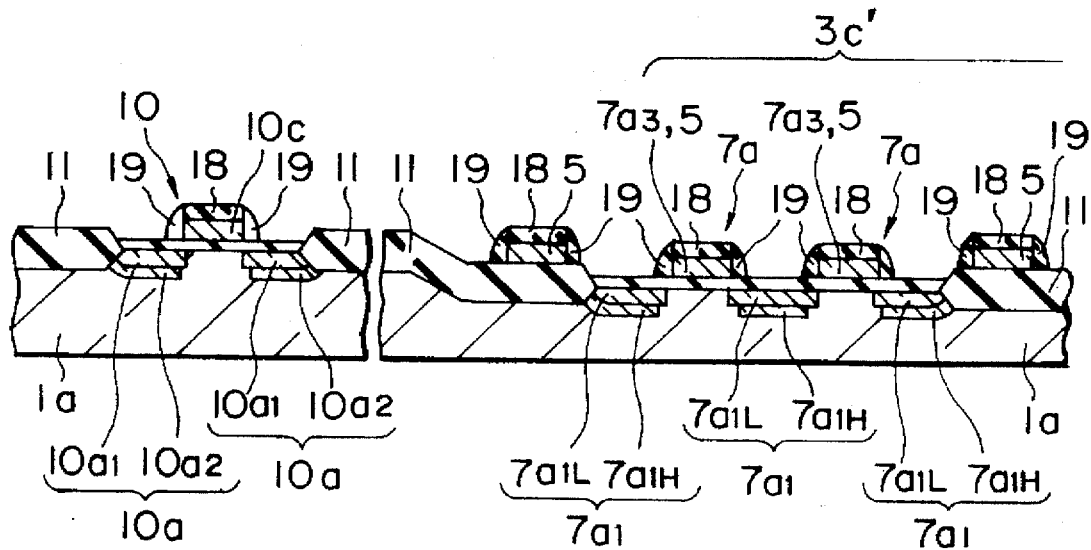

Thereafter, as shown in FIG. 12, semiconductor IC elements such as a switching MOS FET 10 and a transfer MOS FET 7a in element forming region (first substrate surface portion) surrounded by the field insulating film 11 and word lines 5 are formed in the memory cell forming region 3c'.

The word line 5, i.e., a gate electrode 7a3 of the transfer MOS FET 7a is formed by sequentially depositing a conductive film of, for example, low resistivity poly-silicon, a conductive film of, for example, WSi and an insulating film of, for example, $SiO_2$ through CVD process and then, a resulting laminated film is patterned by photolithography technique. Denoted by 18 is an insulating film of, for example, $SiO_2$ which is the uppermost layer on the laminated film.

Next, by using the gate electrode 7a3 of the transfer MOS FET 7a and a gate electrode 10c of the switching MOS FET 10 as a mask, n-type impurity, for example, phosphorus or arsenic is ion-implanted sightly into the semiconductor substrate 1a to form semiconductor regions 7a1L and 10a1 of low concentration in a surface portion of the semiconductor substrate 1a.

Subsequently, an insulating film of, for example, $SiO_2$ is deposited over the semiconductor substrate 1a through, for example, CVD process and the insulating film is etched back to form side walls 19 on the side surface of each of the gate electrode 7a3 of transfer MOS FET 7a and the gate electrode 10c of shared MOS FET 10.

Thereafter, by using the gate electrode 7a3 of transfer MOS FET 7a and the side walls 19 as a mask, an n-type impurity of, for example, phosphorus or arsenic is ion-implanted into the semiconductor substrate 1a at a high concentration to form semiconductor regions 7a1H and 10a2 in a surface portion of the semiconductor substrate 1a.

Figure 14:
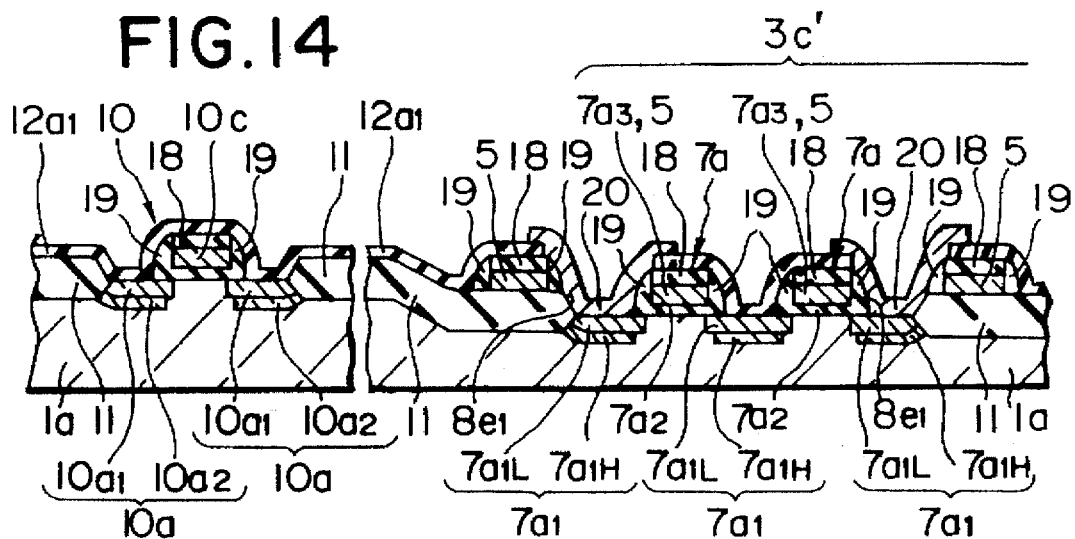

Next, as shown in FIG. 14, an insulating film 12a1 of, for example, BPSG is deposited over the semiconductor substrate 1a to cover the aforementioned semiconductor IC elements and the word lines 5 and then a contact hole 8e1 is formed in the insulating film 12a1 to allow one of the paired semiconductor regions 7a1 of the transfer MOS FET 7a to be exposed through the contact hole.

Subsequently, after a conductive film made of, for example, low resistivity poly-silicon is deposited over the semiconductor substrate 1athe conductive film is patterned by photolithography technique to form a pad film pattern 20.

Figure 15:
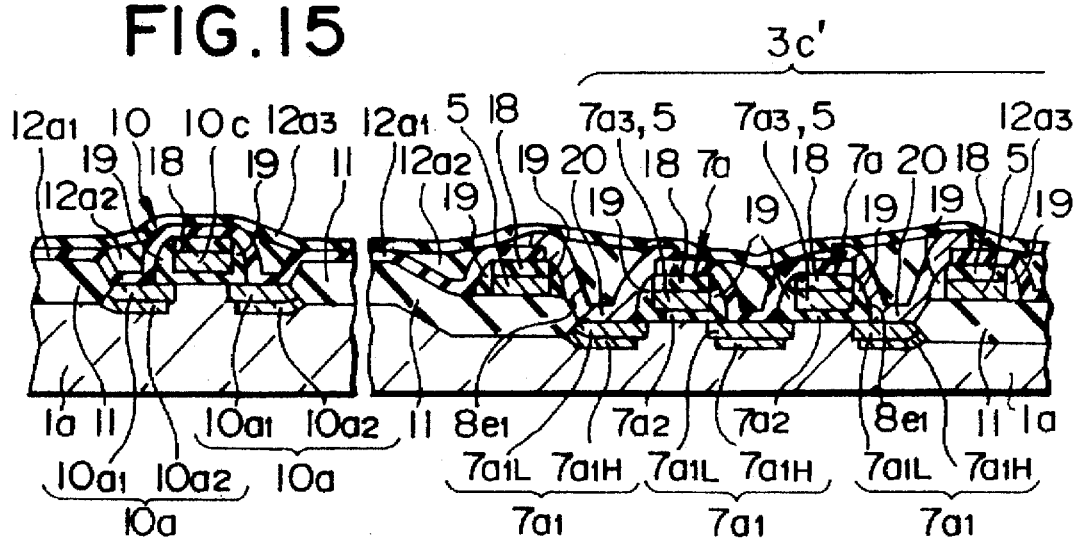

Thereafter, as shown in FIG. 15, an insulating film 12a2 made of, for example, BPSG is deposited over the semiconductor substrate 1a through, for example, CVD process, the insulating film 12a2 is then planarized through reflow process or etchback process, and an insulating film 12a3 of, for example, $SiO_2$ is further deposited through, for example, CVD process.

Figure 16:
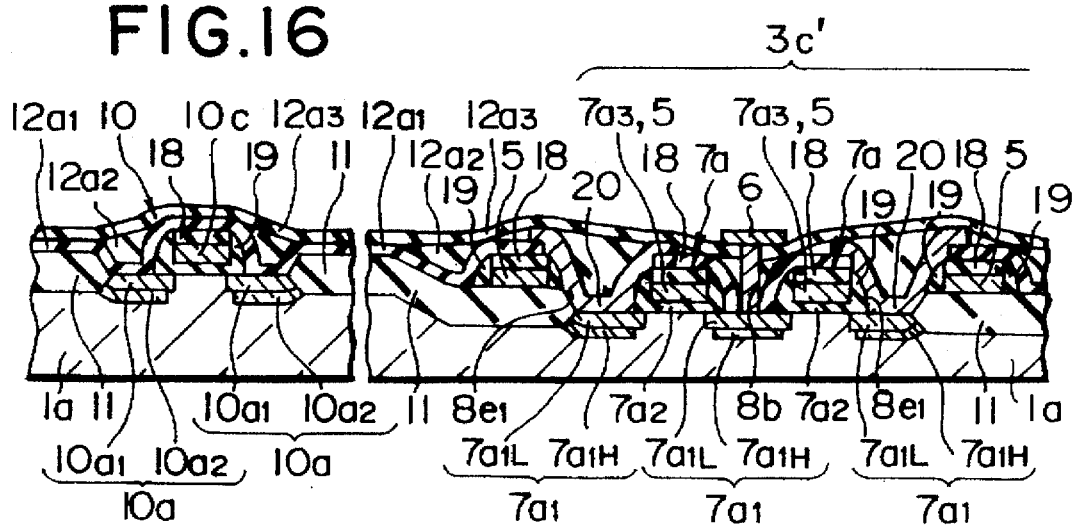

Next, as shown in FIG. 16, there is formed in the insulating films 12a1 to 12a3 a contact hole 8b through which the semiconductor region 7a1L of low concentration is exposed.

Subsequently, after a conductive film of, for example, low resistivity poly-silicon and a conductive film of, for example, $WSi_2$ are deposited sequentially over the semiconductor substrate 1a through, for example, CVD process and a laminated film of these conductive films is patterned by photolithography technique to form data lines 6.

Figure 17:
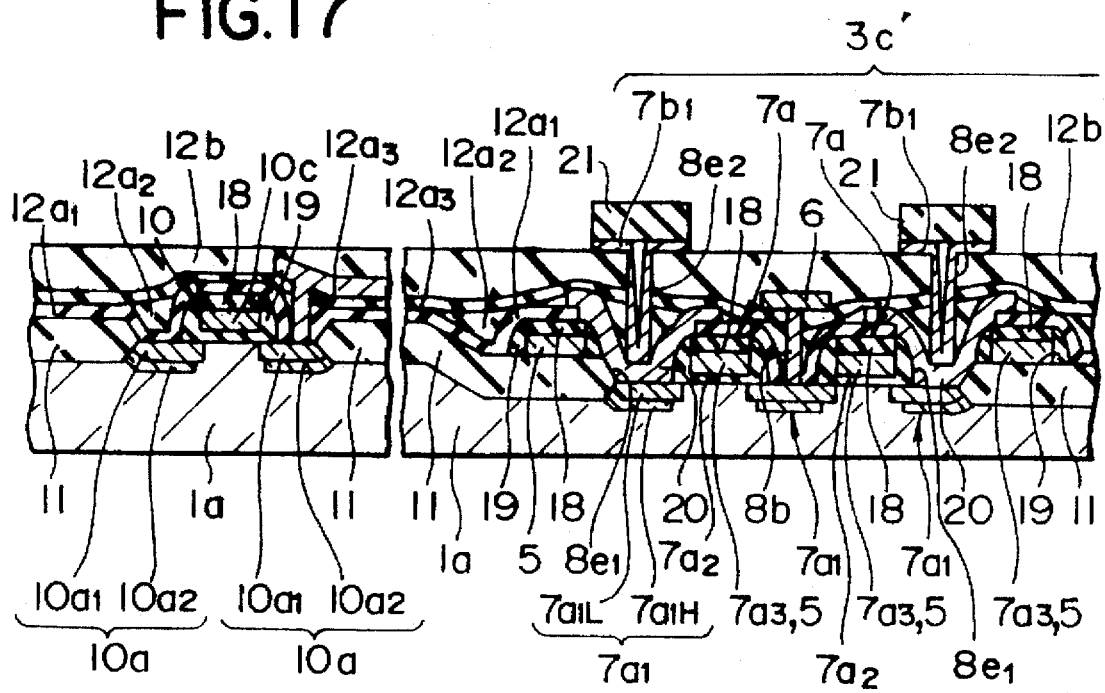

Subsequently, an insulating film of, for example, BPSG is deposited on the insulating film 12a3 through CVD process and a surface portion of this insulating film is subjected to etchback to form an insulating film 12b having a planar surface portion as shown in FIG. 17.

Thereafter, a contact hole 8e2 is formed through the insulating films 12a2, 12a3 and 12b, a conductive film of, for example, low resistivity poly-silicon is then deposited and an insulating film of $SiO_2$ is further deposited on this conductive film.

Next, these conductive film and insulating film are patterned by photolithography technique to form part of a lower electrode 7b1 and an insulating film pattern 21 thereon.

Figure 18:
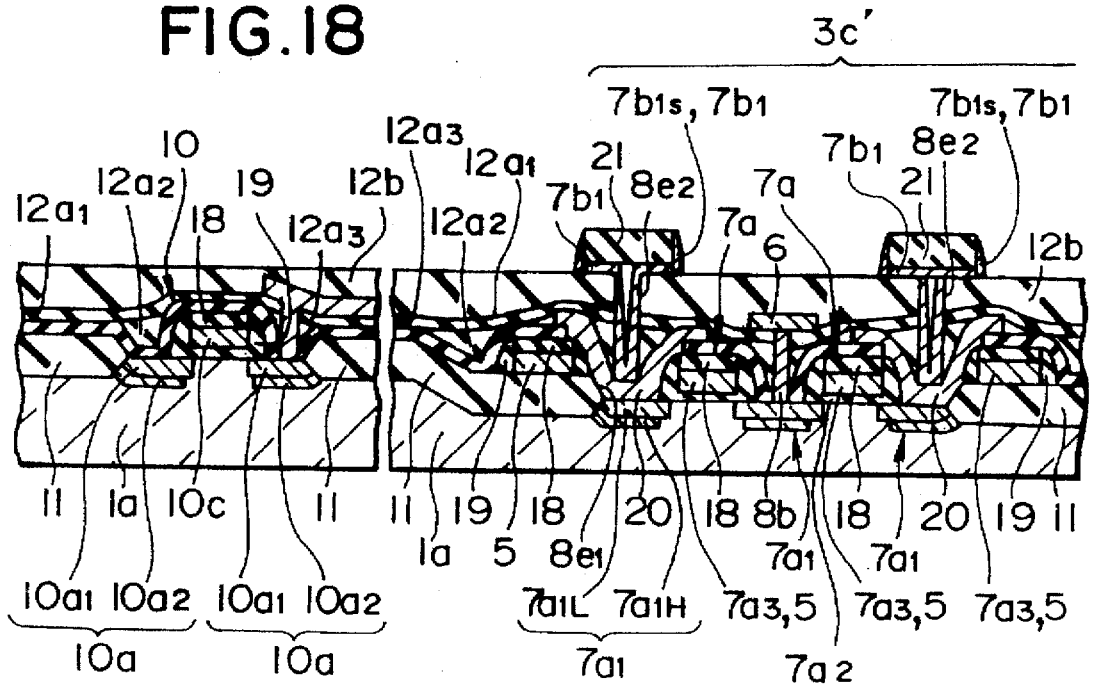

Subsequently, after a conductive film of, for example, low resistivity poly-silicon is deposited over the semiconductor substrate 1a through, for example, CVD process, this conductive film is subjected to etchback to form a side wall 7b1s, forming part of the lower electrode 7b1, on the side surface of the insulating film pattern 21 as shown in FIG. 18.

Figure 19:
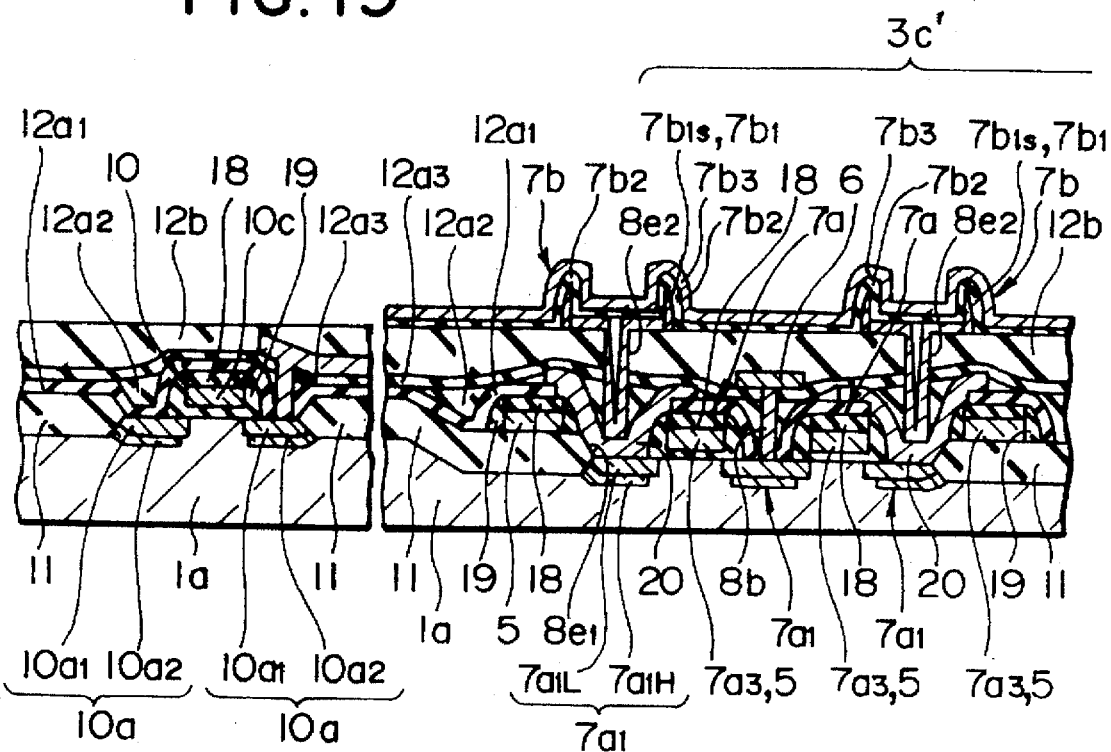

Thereafter, the insulating film pattern 21 is removed and then, as shown in FIG. 19, a dielectric film 7b2 made of, for example, $Si_3N_4$ is deposited over the semiconductor substrate 1a through, for example, CVD process.

Next, after a conductive film of, for example, low resistivity poly-silicon is deposited on the dielectric film 7b2 through, for example, CVD process, the dielectric film 7b2 and the conductive film are patterned to form a capacitor 7b having an upper electrode 7b3 provided on the lower electrode 7b1 through the dielectric film 7b2.

Figure 20:
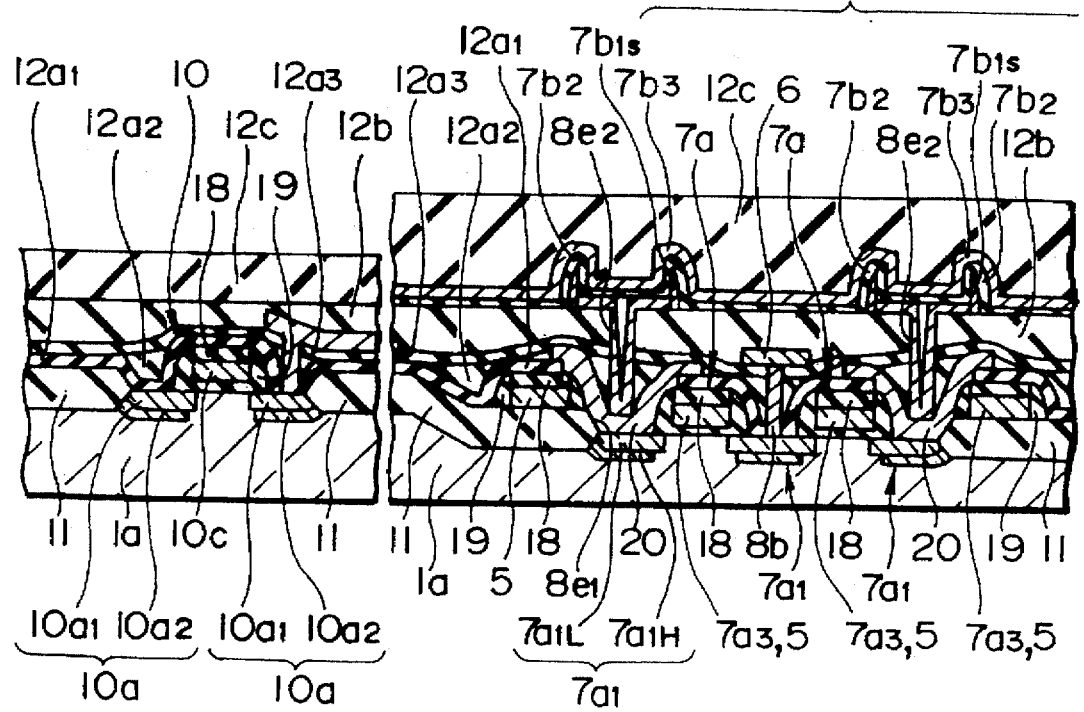

Subsequently, as shown in FIG. 20, an insulating film 12c of, for example, BPSG is deposited through, for example, CVD process to cover the capacitor 7b.

Thereafter, in the present embodiment 1, the semiconductor substrate 1a is subjected to a CMP process so as to substantially planarize the surface of the insulating film 12c as shown in FIG. 21. More specifically, a polishing pad (polishing plate), not shown, is rotated while being in contact with the insulating film 12c, with the result that the insulating film 12dc is etched back by chemical polishing based on an alkaline solution in an abrasive and mechanical polishing based on polishing particles in the abrasive so as to suppress a level difference in the insulating film 12c.

Used as the abrasive for use in the CMP process is an alkaline solution of, for example, about PH 7 to PH 11 containing colloidal silica dispersed therein. Used as the polishing pad is a pad made of, for example, polyurethane. The planarization condition of the insulating film 12c and an insulating film 12e to be described later is set by, for example, polishing time.

Thus, in the present embodiment 1, the memory cell array (unit memory region) 3c having a relatively large size in the direction substantially perpendicular to the substrate surface portion is formed in advance in the recessed region to decrease an initial level difference in the semiconductor chip so that the CMP process is applied to the substrate with the decreased level difference.

This permits enhancement of the planarity of the underlying insulating films for the second and ensuing level wiring conductors. A sample without the recessed region and having a large level difference is now compared with another sample with the recessed region and having a small level difference according to the present embodiment of the invention for the suppression effect due to the CMP process to obtain actually measured values as shown in FIG. 22.

In FIG. 22, the left side indicates the case where the initial level difference is small amounting to about 5000 angstroms and the right side the case where the initial level difference is large amounting to about 9500 angstroms. It is to be noted that while a level difference of about 5000 angstroms is saturated to remain in the case of the larger initial level difference, the level difference decreases to about 1700 angstroms in the case of the smaller initial level difference.

In the succeeding step, as shown in FIG. 21, there is formed in the insulating films 12a to 12c a contact hole 8d which reaches the semiconductor region of the switching MOS FET 10 and then a conductive film of, for example, tungsten is deposited on the insulating film 12c through, for example, spattering process.

Next, that conductive film is patterned by photolithography technique to form first level wiring conductors 9a and 9b (the first level wiring conductors 9a are seen in FIG. 4) at a time.

Figure 23:
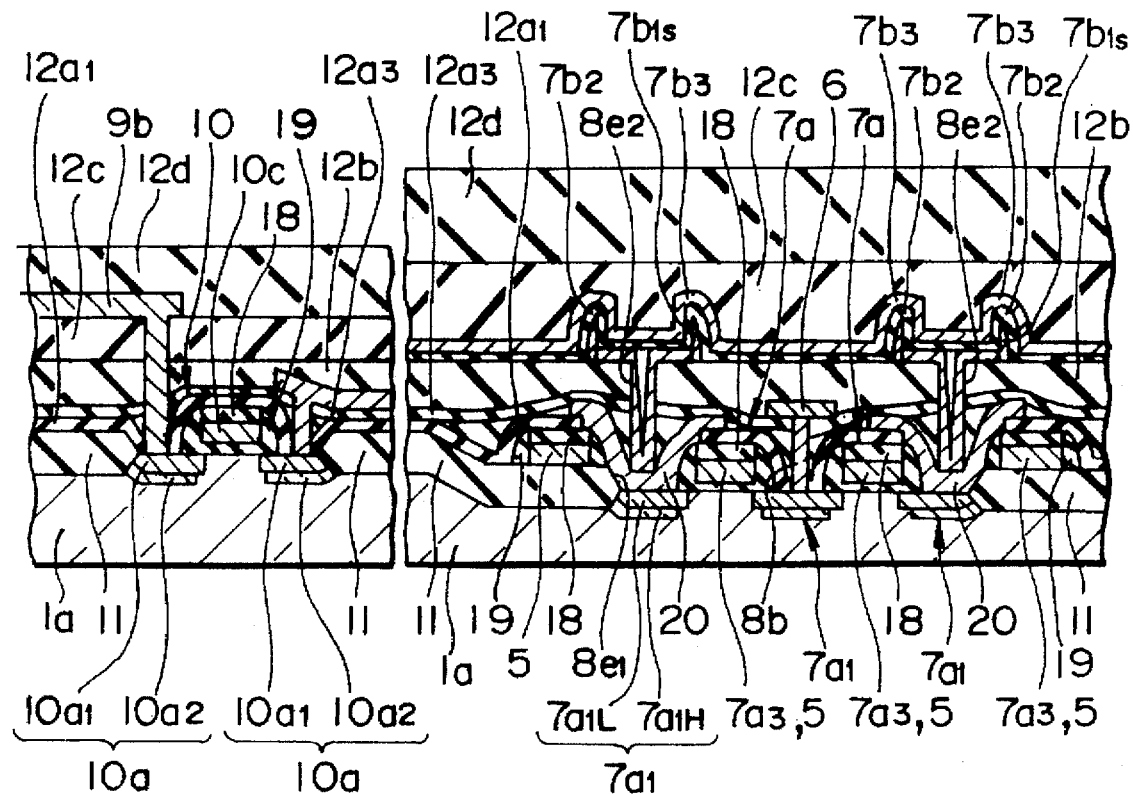

Subsequently, as shown in FIG. 23, an insulating film 12d formed of, for example, a TEOS film and an SOG film is deposited on the insulating film 12c to cover the first level wiring conductors 9a and 9b and like the foregoing, a surface portion of the insulating film 12d is then subjected to a planarization process by, for example, the CMP process.

Figure 24:
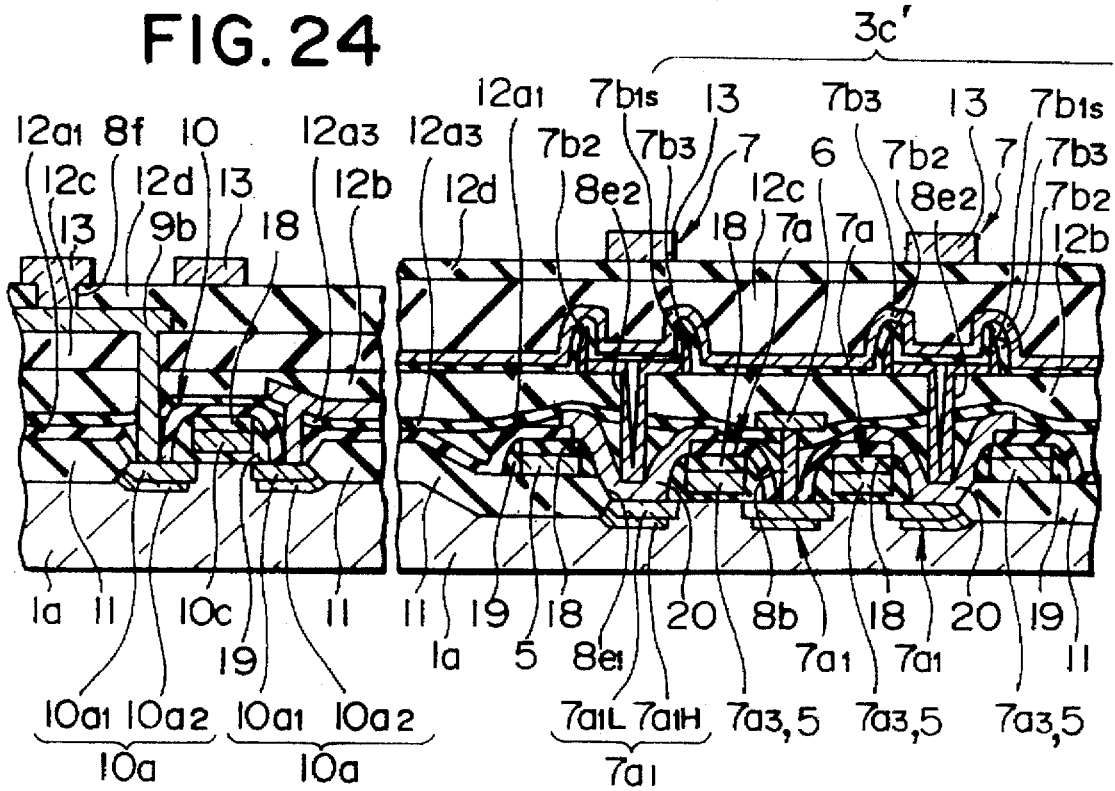

Thereafter, a contact hole 8f is formed in the insulating film 12d, a conductive film of, for example, Al or Al-Si-Cu alloy is then deposited on the insulating film 12d through, for example, spattering process and the conductive film is subsequently patterned using the photolithography technique to form second level wiring conductors 13 as shown in FIG. 24.

In this phase, since the underlying insulating film for the second level wiring conductors 13 is planarized in accordance with the present embodiment 1, the following beneficial effects can be obtained.

In the first place, the second level wiring conductors 13 can be formed pursuant to a rule comparable to the design rule for the memory cell. They can of course be formed in accordance with a rule looser than the design rule for the memory cell.

Secondly, second level wiring conductors 13 can also be laid on a boundary region between the first substrate surface portion and the recessed region and besides, the spacing between adjacent wiring conductors on the boundary region can be less than twice the minimum wiring conductor spacing, thus being reduced as compared to the conventional spacing.

Thirdly, Al can be used as a material of the second level wiring conductors 13. Through this, wiring resistance can be reduced and hence the operation speed of the semiconductor IC device can be enhanced.

Fourthly, since the focus margin in the exposure process for formation of the second level wiring conductors 13 can be enhanced, such an expensive mask as a phase shift mask and a costly aligner which is photosensitive in the design rule are not required to be used in the exposure process. Accordingly, the product fabrication cost can be reduced.

Figure 25:
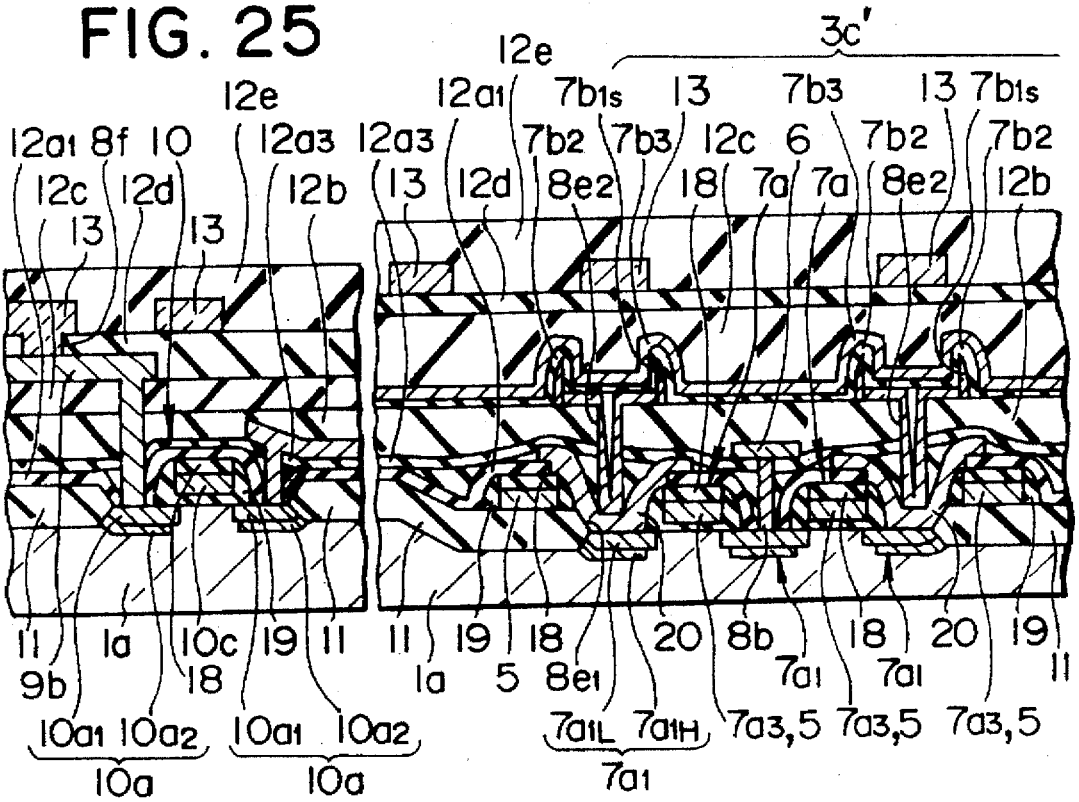

After the second level wiring conductors 13 are formed, an insulating film 12e formed of, for example, a TEOS film and an SOG film is deposited over the semiconductor substrate 1a through, for example, CVD process as shown in FIG. 25.

Next, the semiconductor substrate 1a is subjected to the CMP process so that a planarization process is applied to the surface of the insulating film 12e as shown in FIG. 26. A condition of the CMP process is the same as that described previously.

Subsequently, third level wiring conductors 14 made of, for example, Al or Al-Si-Cu alloy are formed on the insulating film 12e subject to the planarization process. In this phase, the same effects as those obtained when the second level wiring conductors 13 are formed can be attained. Thereafter, an insulating film 12f of, for example, $SiO_2$ is deposited on the insulating film 12e and the second level wiring conductors 13 through, for example, CVD process. The resulting structure then undergoes the ordinary wafer process and the process for fabrication of the semiconductor IC device ends.

Further meritorious effects of the present embodiment 1 will now be described with reference to FIGS. 27 to 32. Shown in FIGS. 27 to 32 are examples of construction conceived by the present inventors without applying teachings of the present invention. But for convenience of explanation, members like those of the present embodiment 1 are designated by like reference numerals.

Shown in FIGS. 27 and 28 is an example of construction using neither the recess technique nor the CMP technique. In this case, the level difference in the second level wiring conductors 13 and in the third level wiring conductors 14 is, for example, about 1.0 µm, so that there occur a short-circuit fault between adjacent wiring conductors due to a decrease in focus margin during formation of the wiring conductors, a breaking fault of wire and a short-circuit fault between adjacent wiring conductors due to a shortage of coverage of Al.

Shown in FIGS. 29 and 30 is an example of construction using only the CMP technique without using the recess technique. In this case, the level difference in the second level wiring conductors 13 and in the third level wiring conductors 14 can be mitigated or suppressed to, for example, about 0.4 to 0.6 µm but because of the initial large level difference, when the underlying insulating film below the wiring conductors in the memory cell array 3c is ground, the underlying insulating film below the wiring conductors in the peripheral region is also ground, with the result that the level difference cannot be substantially zeroed.

Shown in FIGS. 31 and 32 is an example of construction using only the recess technique without using the CMP technique. In this case, too, the level difference in the second level wiring conductors 13 and in the third wiring conductors 14 remains by about 0.7 µm even when embedding is effected by, for example, about 0.3 µm and the fabrication procedure proceeds to the succeeding wiring step while keeping this level difference remaining.

Thus, the following meritorious effects can be attained by the present embodiment 1.

(1) Planarity of the underlying insulating films for the second level wiring conductors 13 and third level wiring conductors 14 can be improved. For example, the level difference in the second level wiring conductors 13 and in the third level wiring conductors 14 can be mitigated to, for example, 0.2 µm. Accordingly, the focus margin in the exposure process for formation of the second level wiring conductors 13 and third level wiring conductors 14 can be enhanced.

(2) Thanks to the above (1), the second level wiring conductors 13 and third level wiring conductors 14 can be formed pursuant to a rule equal to or greater than the design rule for the memory cell. Accordingly, wiring density can be promoted.

(3) Thanks to the above (1), the second level wiring conductors 13 and third level wiring conductors 14 can be laid on a boundary region between the first substrate surface portion and the recessed region and the spacing between adjacent wiring conductors on the boundary region can be less than twice the minimum wiring conductor spacing, being reduced as compared to the conventional spacing. Accordingly, wiring density can be promoted.

(4) Thanks to the above (1), Al can be used as a material of the second level wiring conductors 13 and third level wiring conductors 14. Through this, wiring resistance can be reduced and hence the operation speed of the semiconductor IC device can be improved.

(5) Thanks to the above (1), yield and reliability of the semiconductor IC device can be improved.

(6) Since the focus margin in the exposure process for formation of the second level wiring conductors 13 and third level wiring conductors 14 can be enhanced, such a sophisticated and expensive photomask as a phase shift mask and an expensive aligner photosensitive in the design rule need not be used during the photolithography. Accordingly, the fabrication cost of the semiconductor IC device can be reduced.

(Embodiment 2)

A semiconductor IC device according to another embodiment of the present invention as sectioned at different fabrication steps is shown in fragmentary sectional form in FIGS. 33 to 36.

Figure 33:
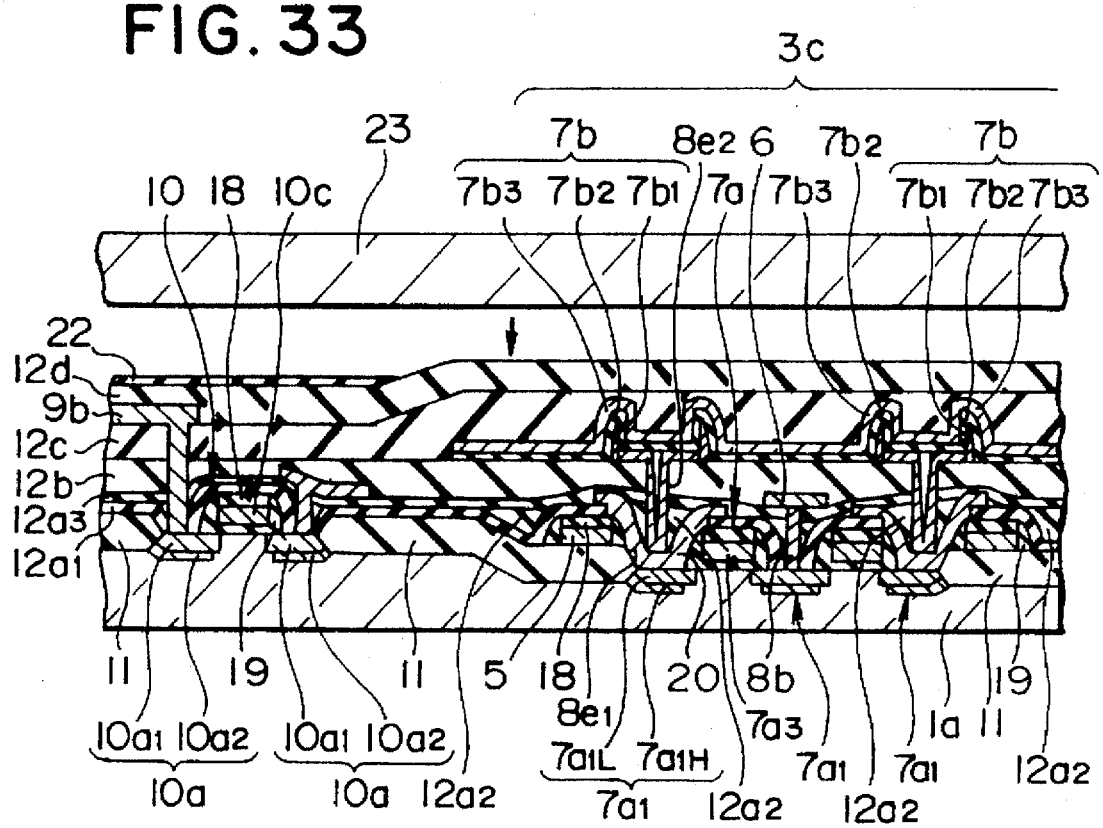
FIGS. 33 to 36 are sectional views showing the essential step in a process for fabrication of a semiconductor IC device according to a second embodiment of the present invention.

In the present embodiment 2, before a planarization process of the surface of an insulating film 12d is effected through the CMP process, a stop layer 22 formed of an insulating film of, for example, $Si_3N_4$ is formed as shown in FIG. 33 on the insulating film 12d at at least a part of a peripheral circuit region.

Figure 34:
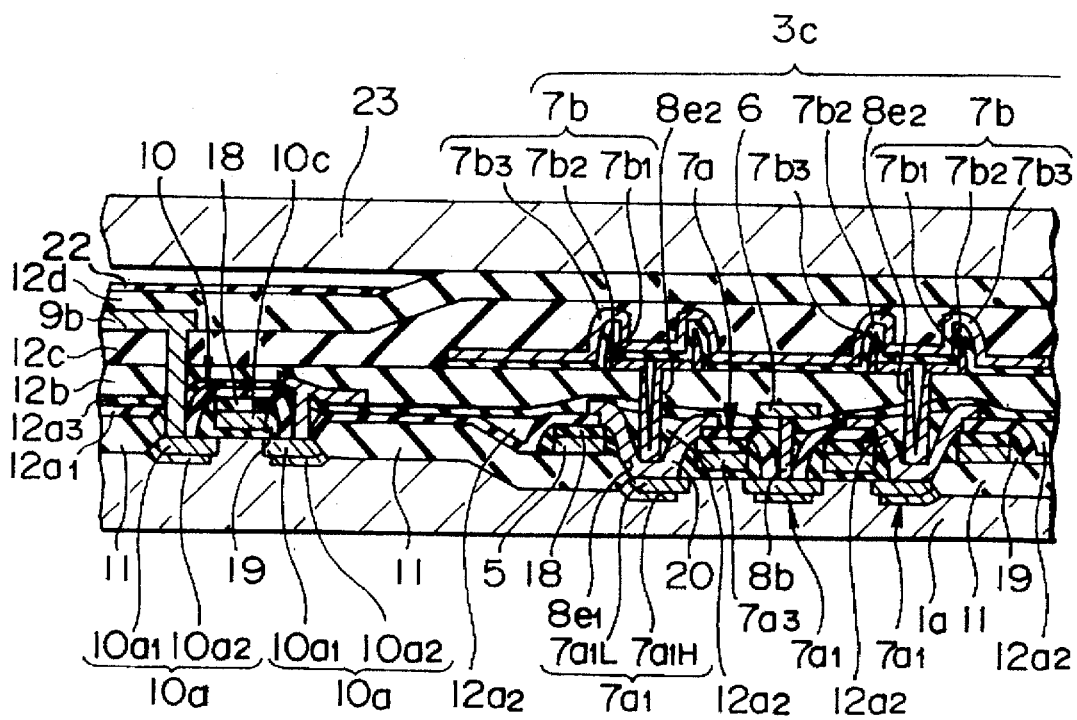

Subsequently, with a polishing pad surface (not shown) of a polishing plate 23 rendered to face the insulating film 12d, the polishing plate 23 is lowered as shown in FIG. 34 to apply the CMP process to the insulating film 12d while the polishing pad of the polishing plate 23 being brought into contact with the insulating film 12d.

Figure 35:
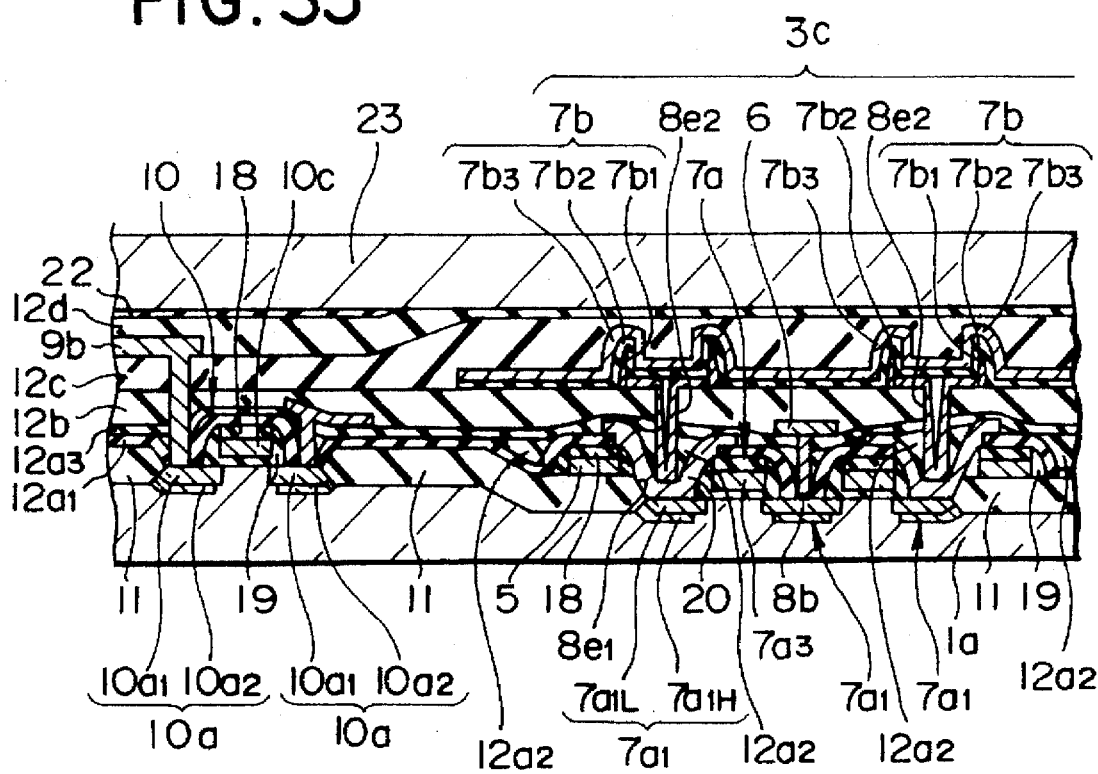
Figure 36:
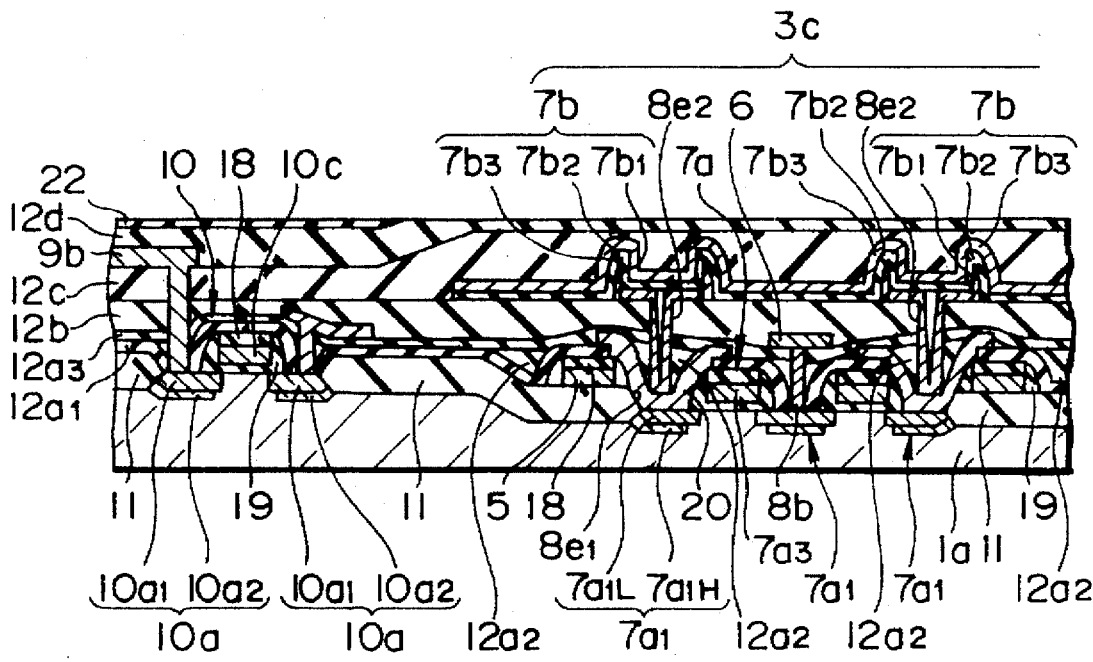

Thereafter, as shown in FIG. 35, the CMP process ends when a predetermined time has elapsed following a reference time point at which the polishing pad of the polishing plate 23 comes into contact with the stop layer 22 and a constituent component (for example, nitrogen component of the stop layer 22) can be detected. In other words, the CMP process ends at the expiration of the predetermined time following the reference time that the stop layer 22 per se begins to undergo chemical and mechanical polishing. Through this, the surface of the insulating film 12d is planarized as shown in FIG. 36. In an alternative, based on the fact that as the polishing pad of the polishing plate 23 begins to polish the stop layer, torque of a motor driving the polishing plate 23 changes, this change in motor torque may be detected to determine the time for ending the CMP process.

Thus, in the present embodiment 2, the following meritorious effects can be obtained in addition to the beneficial effects attained by the foregoing embodiment 1.

More particularly, by precedently forming the stop layer 22 formed of an insulating film on the insulating film 12d at the peripheral circuit region before the CPM process for planarizing the surface of the insulating film 12d underlying the wiring is carried out and by ending the CMP process on the basis of information obtained through detection of a constituent component of the stop layer 22 or detection of a change in torque of the driving motor of the polishing plate 23, the surface of the insulating film 12d can be planarized while maintaining a necessary thickness of the insulating film 12d, that is, securing reliability of the insulating film 12d.

(Embodiment 3)

A semiconductor IC device according to still another embodiment of the present invention as sectioned at different fabrication steps is shown in fragmentary sectional form in FIGS. 37 to 40.

Figure 37:
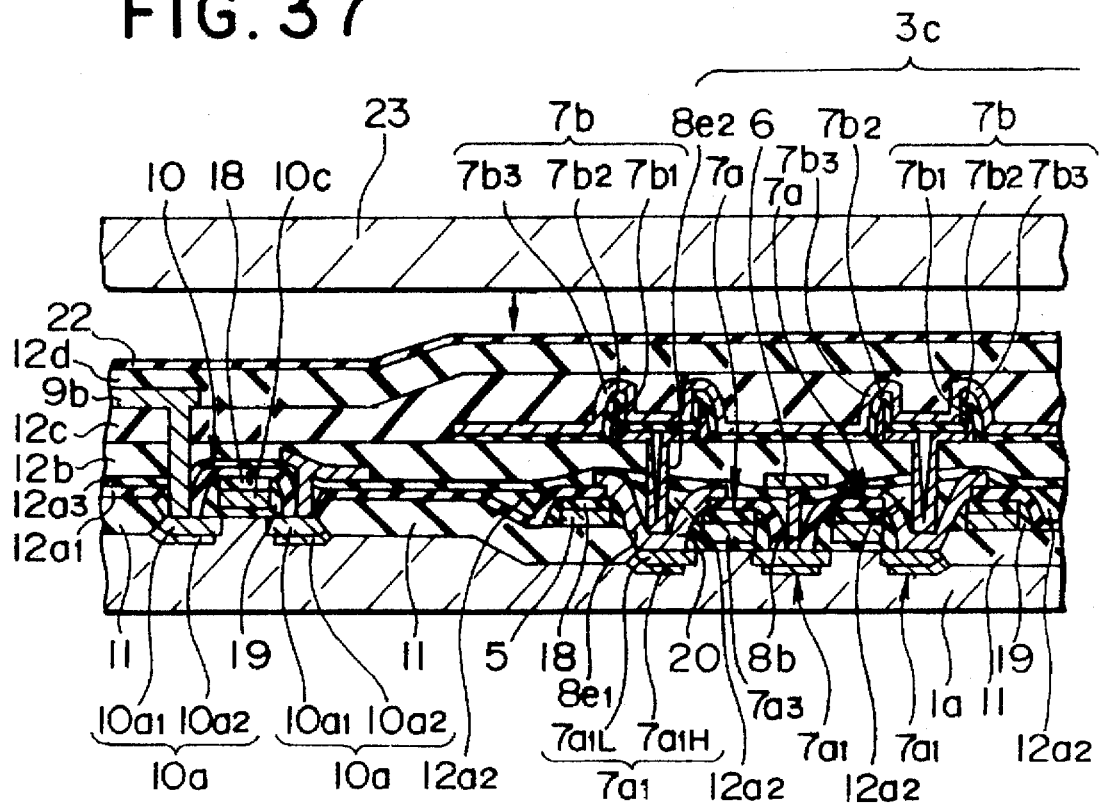
FIGS. 37 to 40 are sectional views showing the essential step in a process for fabrication of a semiconductor IC device according to a third embodiment of the present invention.

In the present embodiment 3, before the surface of an insulating film 12d undergoes the planarization process through the CMP process, a stop layer 22 formed of an insulating film of, for example, $Si_3N_4$ is formed on the entire surface of the insulating film 12d as shown in FIG. 37.

Figure 38:
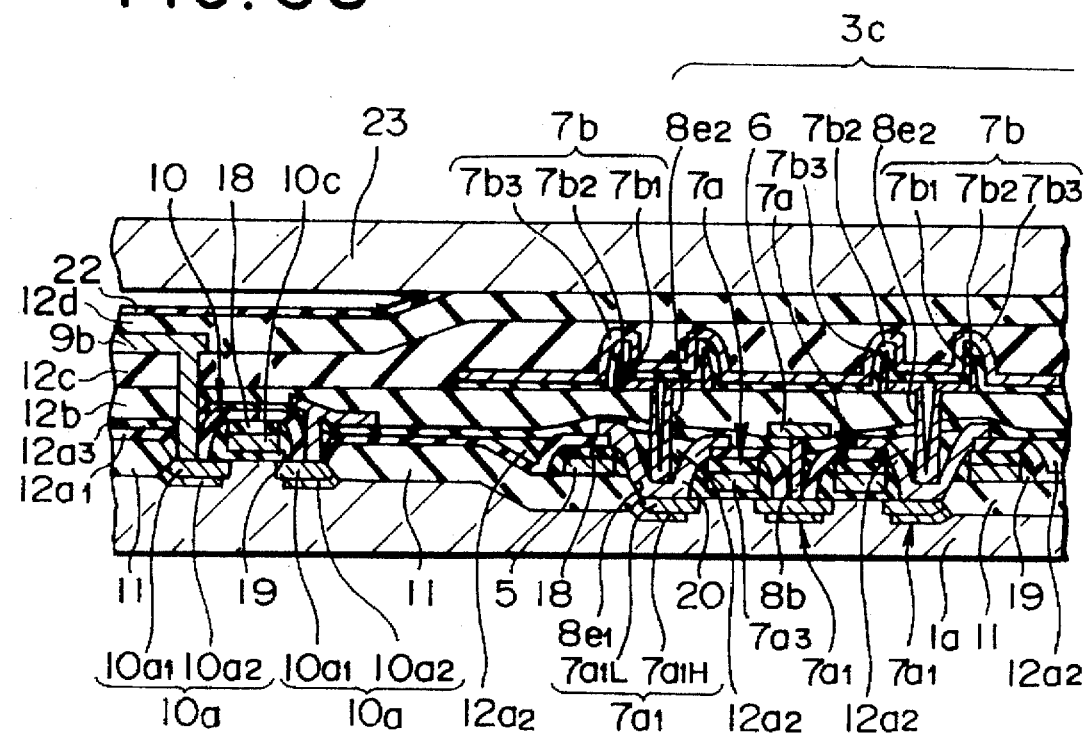

Subsequently, with a polishing pad of a polishing plate 23 rendered to face the insulating film 12d, the polishing plate 23 is lowered and the CMP process is effected while the polishing pad of the polishing plate 23 being brought into contact with the stop layer 22 as shown in FIG. 38.

Figure 39:
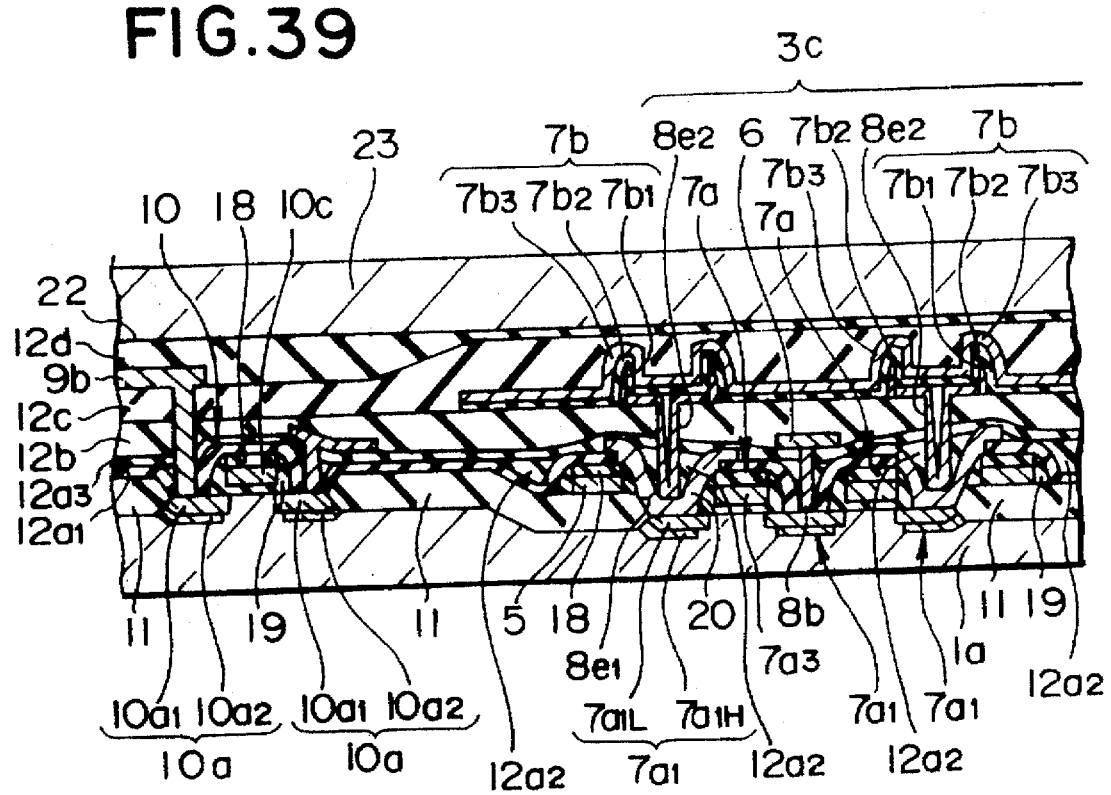
Figure 40:
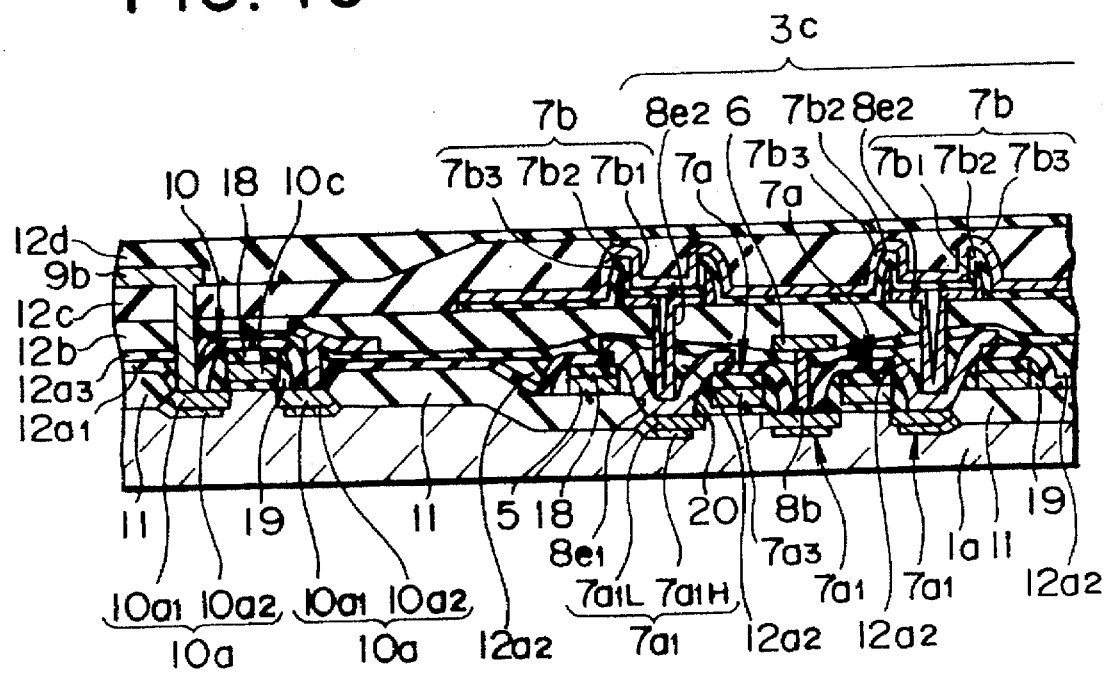

Thereafter, as shown in FIG. 39, the CMP process ends at the time that the stop layer 22 is all removed. In other words, the CMP process ends at the time that a constituent component (for example, nitrogen component) of the stop layer 22 is not detected. Through this, the surface of the insulating film 12d can be planarized as shown in FIG. 40. In an alternative, the time for ending the CMP process may be determined by detecting a change in torque of a motor driving the polishing plate which occurs when polishing of the stop layer 22 ends.

Thus, in the present embodiment 3, the following meritorious effects can be obtained in addition to the beneficial effects attained by the foregoing embodiments 1 and 2.

More particularly, since the stop layer 22 can be conveniently be deposited over the entire major surface of the semiconductor substrate 1a and need not be patterned, the formation of the stop layer 22 does not lead to complexity of the fabrication step of the semiconductor IC device.

While in the foregoing the invention made by the present inventors has been described specifically by way of the preferred embodiments, the present invention is in no way limited to the foregoing embodiments 1 to 3 and obviously can be changed in various ways without departing from the gist of the present invention.

Figure 41:
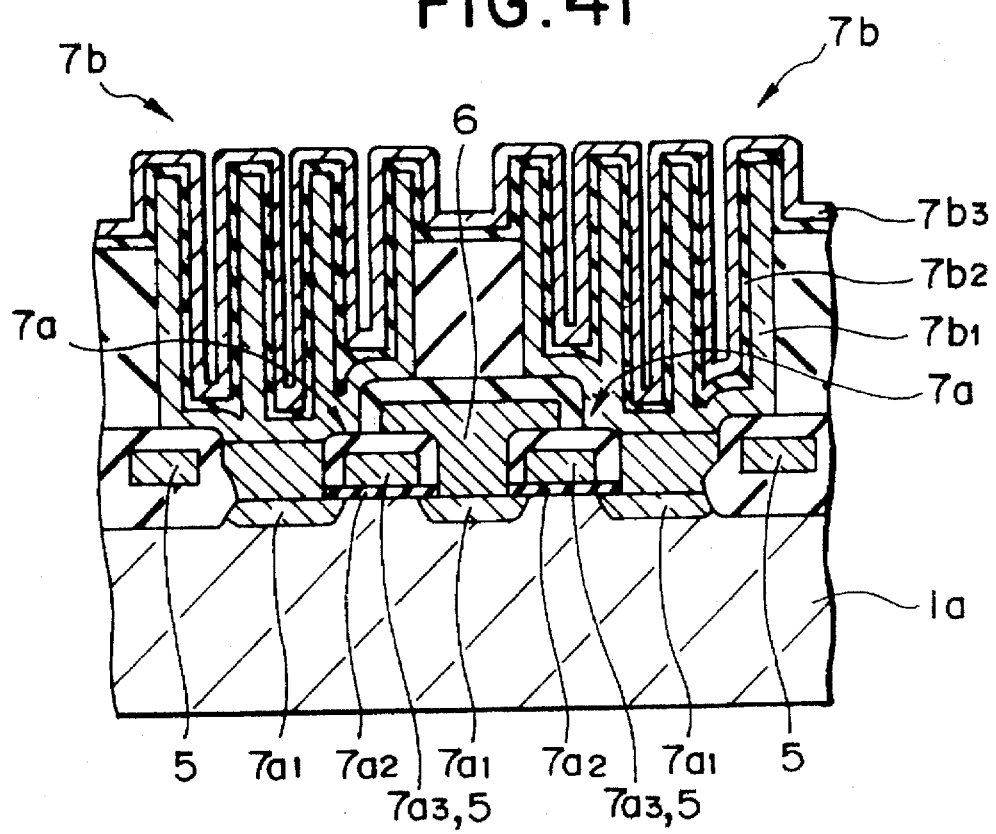
FIG. 41 is a sectional view showing the essential part of a semiconductor IC device according to a fourth embodiment of the present invention.

For example, in the foregoing embodiments 1 to 3, the capacitor of the memory cell has been described as being of a one-layered crown structure but it is not limited thereto and may be of, for example, a double-layered structure as shown in FIG. 41.

Figure 42:
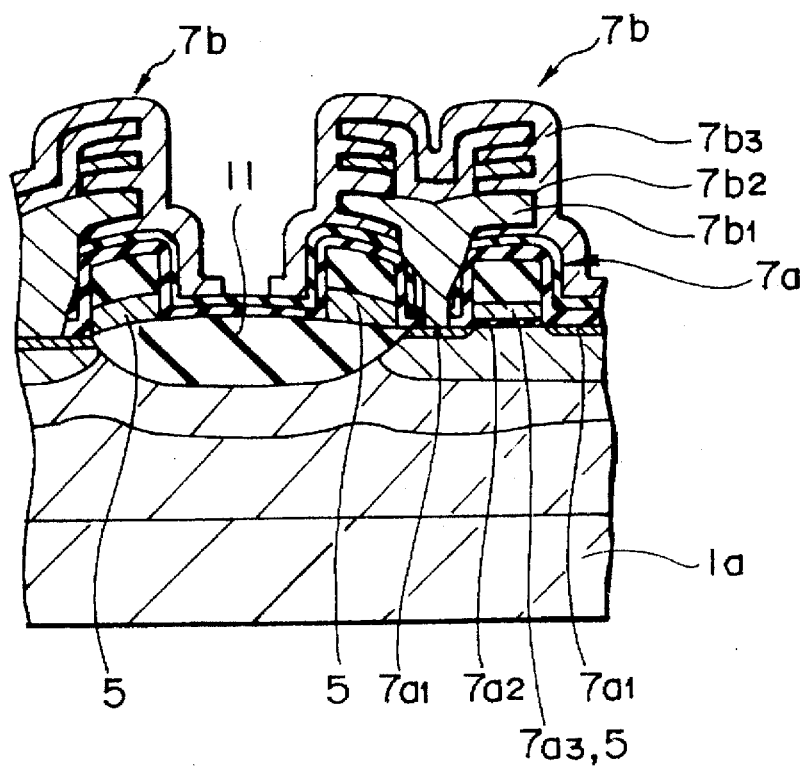
FIG. 42 is a sectional view showing the essential part of a semiconductor IC device according to a fifth embodiment of the present invention.

While in the foregoing embodiments 1 to 3 the capacitor of the memory cell has been described as being of the crown structure, it is not limited thereto and for example, may be of a fin structure as shown in FIG. 42 in which a lower electrode 7b1 has a plurality of blades extending in the horizontal direction in the illustration of FIG. 42.

Further, in the foregoing embodiments, polishing particles in the abrasive have been described as being silica but they are not limited thereto and may be changed variously, for example, to cesium oxide ($CeO_2$).

Further, in the foregoing embodiments, the method for formation of the recess structure has been described as being the selective oxidation process but this is not limitative and may be changed in various ways so that the recess structure may be formed through, for example, a wet etching process which uses an alkaline solution and which depends on the crystal face of Si. In this case, an oblique plane of (111) plane can be formed relative to a (100) Si plane. The recess structure may also be formed using the dry etching process and the isotropic wet etching process in combination.

While in the foregoing description the invention made by the present inventors has been described as being applied to the 64M-bit DRAM referred to as a utilization field in the background of the invention, this is not limitative and the present invention may be applied variously, for example, to a 256M-bit DRAM or another type of semiconductor IC device such as a semiconductor memory circuit with logic having a logic circuit and a stacked capacitor structure DRAM on the same semiconductor substrate.

We claim:

1. A method of fabricating a semiconductor integrated circuit device having first and second circuit regions provided at first and second surface portions of a semiconductor substrate, said first and second circuit regions being capable of performing first and second functions and including elements having relatively small and large sizes as generally measured in a direction perpendicular to said surface portions of the semiconductor substrate, respectively, an insulating film covering said first and second circuit regions, and wiring conductors provided on said insulating film, the method comprising the steps of:

preparing a semiconductor substrate having first and second surface portions;

recessing the second surface portion of said semiconductor substrate;

forming elements of the first circuit region at a first surface portion of said semiconductor substrate and elements of the second circuit region at said recessed second surface portion of said semiconductor substrate;

forming an insulating film to cover said first and second circuit regions, with a level difference being caused between first and second portions of said insulating film on said first and second circuit regions, respectively, said second portion of said insulating film being at a higher level than said first portion of said insulating film;

effecting chemical-mechanical planarization of said insulating film to suppress said level difference in said insulating film for enhancing a focus margin for successive photolithographic steps; and forming at least one wiring conductor on said insulating film with said suppressed level difference, enjoying said enhanced focus margin.

2. A method according to claim 1, wherein said elements of the second circuit region includes an array of memory cells, and said elements of the first circuit region includes those of peripheral circuits for the memory cell array.

3. A method according to claim 2, wherein each of said memory cells of said memory cell array includes one insulated-gate field effect transistor and a stacked capacitor electrically connected thereto.

4. A method according to claim 3, wherein said stacked capacitor of each of said memory cells in said memory cell array is substantially in a cylindrical form.

5. A method according to claim 3, wherein said stacked capacitor of each of said memory cells in said memory cell array is of the type having stacked plural fins.

6. A method according to claim 1, wherein said first and second surface portions of said semiconductor substrate are arranged adjacent each other so that said first and second portions of said insulating film are continuing from each other with a boundary region lying therebetween sloping across said suppressed level difference and said wiring conductor is formed at least on said boundary region.

7. A method according to claim 1, wherein said wiring conductor forming step is carried out using a design rule looser than that used in said step of forming said elements of the second circuit region.

8. A method according to claim 1, further comprising the step of forming a stop layer on at least a part of said first portion of said insulating film before said chemical-mechanical planarization of said insulating film, and said chemical-mechanical planarization is performed by use of a polishing plate and is continued until said stop layer is contacted by said polishing plate.

9. A method according to claim 1, further comprising the step of forming a stop layer on said first and second portions of said insulating film before said chemical-mechanical planarization of said insulating film, and said chemical-mechanical planarization is performed by use of a polishing plate and is continued until the whole of said stop layer is removed by said polishing plate.

10. A method according to claim 1, further comprising the steps of:

forming a first wiring pattern of a polysilicon, a polycide or a refractory metal before said chemical-mechanical planarization of said insulating film, in which said first wiring pattern includes connection conductors for at least one of said first and second circuit regions; and forming a second wiring pattern of aluminum after said chemical-mechanical planarization of said insulating film, in which said second wiring pattern includes said wiring conductors on said insulating film with said suppressed level difference.

* * * * *